United States Patent
Namatsu et al.

(10) Patent No.: US 8,026,047 B2
(45) Date of Patent: *Sep. 27, 2011

(54) RESIST PATTERN FORMING METHOD, SUPERCRITICAL PROCESSING SOLUTION FOR LITHOGRAPHY PROCESS, AND ANTIREFLECTION FILM FORMING METHOD

(75) Inventors: Hideo Namatsu, Atsugi (JP); Mitsuru Sato, Kawasaki (JP)

(73) Assignees: Nippon Telegraph and Telephone Corporation, Tokyo (JP); Tokyo Ohka Kogyo Co., Ltd., Kanagawa-ken (JP)

( * ) Notice: Subject to any disclaimer, the term of this patent is extended or adjusted under 35 U.S.C. 154(b) by 539 days.

This patent is subject to a terminal disclaimer.

(21) Appl. No.: 11/795,990

(22) PCT Filed: Jan. 27, 2006

(86) PCT No.: PCT/JP2006/301300
§ 371 (c)(1),
(2), (4) Date: Jul. 25, 2007

(87) PCT Pub. No.: WO2006/080429
PCT Pub. Date: Aug. 3, 2006

(65) Prior Publication Data
US 2008/0124648 A1 May 29, 2008

(30) Foreign Application Priority Data
Jan. 27, 2005 (JP) .................. 2005-020451

(51) Int. Cl.
*G03F 1/00* (2006.01)

(52) U.S. Cl. .................. 430/322; 430/312; 430/331

(58) Field of Classification Search .................. 430/331, 430/271.1, 312, 322
See application file for complete search history.

(56) References Cited

U.S. PATENT DOCUMENTS

| | | |
|---|---|---|
| 5,939,235 A | 8/1999 | Kondo et al. |
| 6,177,231 B1 | 1/2001 | Ishii et al. |
| 2003/0224589 A1 | 12/2003 | Endo et al. |
| 2004/0018452 A1 | 1/2004 | Schilling |
| 2004/0087457 A1 | 5/2004 | Korzenski et al. |
| 2006/0003271 A1* | 1/2006 | Clark et al. .................. 430/329 |

(Continued)

FOREIGN PATENT DOCUMENTS

AU  2003-289123 A1  6/2004

(Continued)

OTHER PUBLICATIONS

"Nano edge roughness in polymer resist patterns", Yoshimura et al., Applied Physics Letters, vol. 63, pp. 764-766, 1993.

(Continued)

*Primary Examiner* — Thorl Chea
(74) *Attorney, Agent, or Firm* — Harness, Dickey & Pierce, P.L.C.

(57) ABSTRACT

A fine and high-accuracy pattern, which is also excellent in either or both of high sensitivity and etching resistance can be provided. Disclosed is a resist pattern forming method in which a single- or multi-layered film 2 is formed on a substrate 1 and a resist pattern is formed on the film 2 through a lithography technique including exposure and development, the method comprising performing supercritical processing in which the film 2 is brought into contact with a supercritical processing solution 5' in which an organic matter 4 is dissolved before the exposure or development.

8 Claims, 5 Drawing Sheets

U.S. PATENT DOCUMENTS

| | | | |
|---|---|---|---|
| 2006/0063102 A1* | 3/2006 | Kubota et al. | 430/270.1 |
| 2006/0127799 A1 | 6/2006 | Kubota et al. | |
| 2006/0134555 A1* | 6/2006 | Park et al. | 430/311 |

FOREIGN PATENT DOCUMENTS

| | | | |
|---|---|---|---|
| AU | 2003-289125 A1 | | 6/2004 |
| EP | 1495366 A1 | | 10/2003 |
| EP | 1592520 A2 | | 11/2005 |
| JP | 6-148889 | | 5/1994 |
| JP | 6-230574 | | 8/1994 |
| JP | 10-282649 | | 10/1998 |
| JP | 2000-089477 A | | 3/2000 |
| JP | 2000-112150 | * | 4/2000 |
| JP | 2002-341538 | | 11/2002 |
| JP | 2003-140359 A | | 5/2003 |
| JP | 2003-224050 A | | 8/2003 |
| JP | 2003-338452 A | | 11/2003 |
| JP | 2004-233953 A | | 8/2004 |
| JP | 2004-233954 A | | 8/2004 |
| JP | 2005-202176 | | 7/2005 |
| JP | 2005-522737 A | | 7/2005 |
| JP | 2005-223118 | * | 8/2005 |
| JP | 2005-223118 A | | 8/2005 |
| JP | 2006-505010 A | | 2/2006 |
| WO | 03/087936 A | | 10/2003 |
| WO | 2004/42472 A2 | | 5/2004 |
| WO | 2004/051375 A1 | | 6/2004 |
| WO | 2004/51380 A1 | | 6/2004 |
| WO | 2005/072235 A2 | | 8/2005 |

OTHER PUBLICATIONS

"Free Volume and Tacticity in Polystyrenes", Dammert, et al., Maclomolecules, vol. 32, pp. 1930-1938, 1999.

* cited by examiner

RESIST PATTERN FORMING METHOD, SUPERCRITICAL PROCESSING SOLUTION FOR LITHOGRAPHY PROCESS, AND ANTIREFLECTION FILM FORMING METHOD

TECHNICAL FIELD

The present invention relates to a resist pattern forming method, a supercritical processing solution for lithography process, and an antireflection film forming method.

This application claims priority on Japanese Patent Application No. 2005-020451 filed on Jan. 27, 2005, the disclosure of which is incorporated by reference herein.

BACKGROUND ART

To produce large-scale and high-performance devices including LSI (Large Scale Integration), an ultrafine pattern is required. Such a pattern is a resist pattern formed through exposure, development, and washing (rinsing), or an etching pattern formed through etching and washing (water-washing).

A resist is a polymer material which is photosensitive to light, X-ray, and electron beam, and exposure is performed by irradiating the resist with light or electron beam through a mask having a pattern formed based on circuit design.

When a photosensitive resist film is exposed, the molecular weight and molecular structure of the exposed area vary to cause a difference in solubility in a developer between the exposed area and the unexposed area, and thus a photosensitive resist pattern can be formed by a development treatment utilizing a difference in solubility.

Using this resist pattern as a mask, an insulation film and a conductive film formed on the substrate are partially etched, the unnecessary resist pattern is removed, and thus transfer of the pattern onto the substrate is completed.

A conventional resist is described in Patent Reference 1.

In the formation of a photosensitive resist pattern, a resist requires various properties, in which (1) sensitivity, (2) pattern size controllability, and (3) etching resistance are recently considered to be particularly important.

(Patent Reference 1)
Japanese Unexamined Patent Application, First Publication No. 2002-341538
(Non-Patent Reference 2)
Applied Physics Letters, Vol. 63, page 764, 1993

DISCLOSURE OF THE INVENTION

Problems to be Solved by the Invention

However, all of these properties have never been satisfied. The factors will now be described.

First, (1) sensitivity is not enhanced because a sufficient amount of a photosensitizer such as acid generator component cannot be introduced in a resist. In a resist solution, storage stability as a resist solution is considered to be most important, and the photosensitizer can be the cause of deteriorating the storage stability as a resist solution. That is, as the amount of the photosensitizer mixed in the resist solution becomes large, sensitivity increases the more, but, at the same time, the resist solution is deteriorated the more rapidly. Particularly in the system in which an acid generator such as chemically amplified photoresist promotes the resist reaction, sensitivity is influenced by the amount of the acid generator.

However, a large amount of the acid generator deteriorates storage stability as a resist solution to cause variation in sensitivity.

Therefore, if the photosensitizer can be introduced immediately before exposure of the resist, particularly immediately after formation of a film, this problem can be solved.

Next, as one of causes of deteriorations of (2) pattern size controllability, pattern roughness is recently exemplified.

This is also referred to as line edge roughness or line width roughness. In a resist pattern, there arises a problem that the side of the resist pattern is not flat, but irregularly, and thus the size cannot be controlled [see, for example, Patent Reference 2 (Applied Physics Letters, Vol. 63, page 764, 1993)].

This problem is involved in resolution, and thus is an important problem to be solved.

Next is about (3) etching resistance.

Etching resistance can be improved by mixing an etching resistance improver with the resist composition. The etching resistance improver is composed of, for example, a structure containing carbon atoms, and as the number of carbon atoms increases, etching resistance tends to be improved. However, there is a problem that it becomes impossible to dissolve in a solvent for resist when the number of carbon atoms increases.

That is, if these three problems are solved, a resist pattern having excellent sensitivity, resolution, and etching resistance can be formed, and an advanced high-function and high-performance device can be produced.

However, it is impossible to solve these problems using conventional resist materials.

The present invention has been made so as to solve the above problems, and an object thereof is to provide a technique capable of forming a fine and high-accuracy pattern, which is preferably excellent in either or both of high sensitivity and etching resistance.

To achieve the above object, the present invention employed the following compositions.

A first aspect is a resist pattern forming method, which includes the steps of providing a single- or multi-layered film on a substrate, forming a resist pattern on the film through a lithography technique including exposure and development, and performing supercritical processing in which the film is brought into contact with a supercritical processing solution in which an organic matter is dissolved before the exposure or development.

A second aspect is a supercritical processing solution for lithography process which is prepared by dissolving an organic matter in a substance serving as a supercritical fluid, followed by enclosing them in a high pressure vessel.

EFFECTS OF THE INVENTION

According to the present invention, it is possible to provide a technique capable of forming a fine and high-accuracy pattern, which is preferably excellent in either or both of high sensitivity and etching resistance.

BRIEF DESCRIPTION OF THE REFERENCE SYMBOLS

Figure 1A:
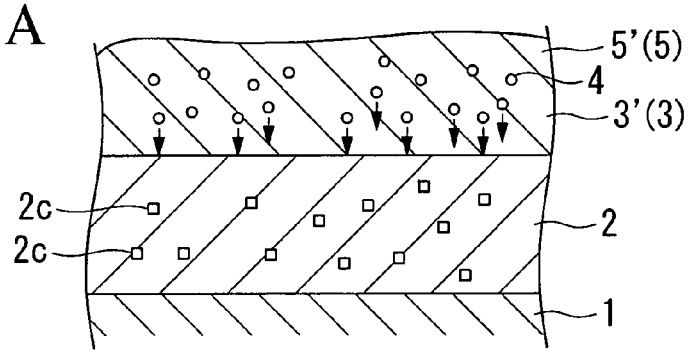
FIG. 1A to FIG. 1E are flow chart for explaining an example of a pattern forming method in the embodiment of the present invention.

1: Substrate
2: Film
2a: Exposed area
2b: Unexposed area
2c: Microgaps
3: Supercritical precursor fluid
3': Supercritical fluid
4: Organic matter
5': Supercritical processing solution
5: Supercritical precursor processing solution
7: Mask pattern

BEST MODE FOR CARRYING OUT THE INVENTION

<Resist Pattern Forming Method>

First Embodiment

The resist pattern forming method is a resist pattern forming method, which includes the steps of forming a single- or multi-layered film on a substrate, forming a resist pattern on the film through a lithography technique including exposure and development, and performing supercritical processing in which a supercritical processing solution in which an organic matter is dissolved is brought into contact with the film before the exposure or development.

In the resist pattern forming method of the present invention, preferred aspect of the pattern forming method of the present invention is that a film is formed on a substrate by a spin coating method using a solution prepared by dissolving a film forming component (resin component) having transparency to a predetermined light source, and then a supercritical fluid prepared by dissolving an organic matter capable of entering into micro molecular gaps existing in the film is brought into contact with the film. As a result, the problem (1) can be solved. Also, either or both of the problems (2) to (3) can be solved by properties of the organic matter.

Embodiments of the present invention will now be described.

FIG. 1A to FIG. 1E are process drawings for explaining an example of a pattern forming method in the embodiment of the present invention.

First, as shown in FIG. 1A, a film 2 (a resist film or a resin film) is formed on a desired substrate 1, for example, a silicon substrate.

For example, on the substrate 1, a solution containing an acryl-based resin is applied in a thickness of about 500 nm.

Then, the substrate 1 on which the film 2 is formed is placed in a high pressure vessel which can endure a pressure enough to bring into a supercritical state.

Then, a supercritical processing solution 5' composed of a supercritical fluid 3' containing a small organic matter 4 capable of entering into intermolecular microgaps 2c which exists in the film 2 is introduced in the vicinity of the film 2.

For example, the organic matter 4 is put in a tank or a cylinder (hereinafter sometimes referred to as a "supercritical fluid supply system") connected to the high pressure vessel and, while dissolving the organic matter 4 by introducing a supercritical fluid 3' (for example, supercritical carbon dioxide) into the tank or a cylinder, a supercritical processing solution 5' composed of the supercritical fluid 3' in which the organic matter 4 is dissolved is introduced into the high pressure vessel.

The pressure upon introduction is adjusted to a critical pressure or more. In the case of carbon dioxide, the pressure is 7.38 MPa or more. By adjusting the temperature in the high pressure vessel to a critical temperature or higher (31.1° C. or higher in the case of carbon dioxide), carbon dioxide introduced into the high pressure vessel is brought into a supercritical state.

The "supercritical fluid supply system" may be in a supercritical state, or a lower state (liquefied state: supercritical precursor state).

Also, the above-described supercritical state includes a subcritical state.

Further, dissolution of the organic matter 4 is performed in the "supercritical fluid supply system" in this example, but the organic matter 4 may be dissolved in the high pressure vessel.

Furthermore, as described hereinafter, a substance (supercritical processing solution 5') in which a given amount of the organic matter 4 is dissolved may be introduced into the "supercritical fluid supply system".

Figure 1B:
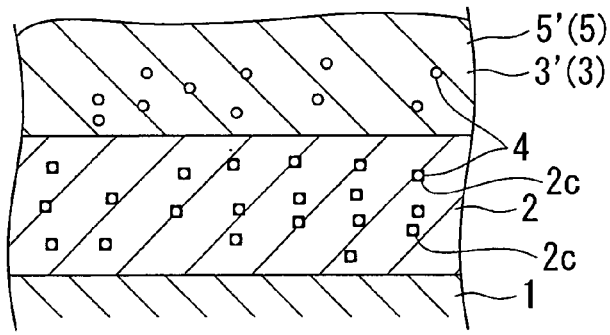

As shown in FIG. 1A and FIG. 1B, the supercritical processing solution 5' prepared by dissolving the organic matter 4 in the supercritical fluid 3' is brought into contact with the film 2, and then the supercritical processing solution 5' diffuses into microgaps 2c in the film 2 easily and quickly, as shown in FIG. 1B. The organic matter 4 diffuses into the film 2 in a state of being surrounded with the supercritical fluid 3' (cluster state).

Figure 1C:
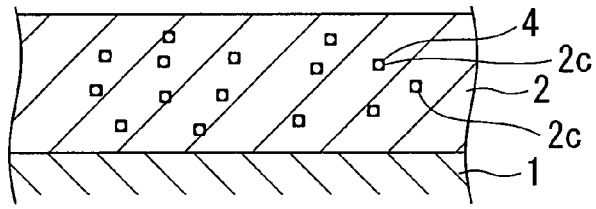

Then, as shown in FIG. 1C, when the pressure in the high pressure vessel is gradually reduced, only the supercritical fluid 3' is expelled from the high pressure vessel, therefore only the organic matter 4 is remained in microgaps 2c in the film 2.

In the step shown in FIG. 1A, first, the "supercritical precursor processing solution 5" prepared by dissolving the "supercritical precursor fluid 3" in a liquid phase state in the organic matter 4 is introduced into the high pressure vessel, filled in the vicinity of the film 2, and then supercritical processing can be performed by bringing the high pressure vessel into a supercritical state.

In the present specification, the "supercritical precursor fluid" means a fluid in a liquid phase state before being brought into a supercritical fluid.

Figure 2:
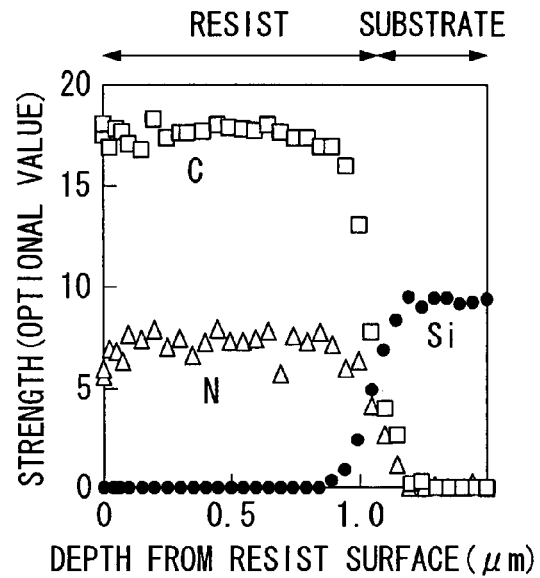
FIG. 2 is a graph showing data which demonstrate that an organic matter 4 can be uniformly dispersed in a resist film (film 2).

FIG. 2 is a graph showing data which demonstrate that an organic matter 4 can be uniformly dispersed in a resist film (film 2).

Using X-ray photoelectron spectroscopy, depth analysis of the film 2 was performed by sputtering with argon ions.

Carbon is mainly derived from a resist film, and nitrogen is derived from an introduced organic matter which is represented by the following chemical formula (1).

[Chemical Formula 1]

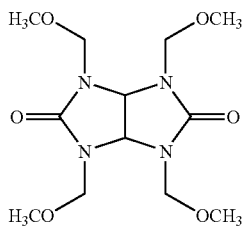

(1)

That is, it shows distribution of a resist film in which an organic matter having nitrogen molecules is introduced through supercritical processing.

It is found that it is possible to uniformly introduce into a thick film having a thickness of 1 μm.

The result demonstrates that molecules of the organic matter having nitrogen, represented by the chemical formula (1), diffuse into microgaps in the resist film in the state of being surrounded with supercritical carbon dioxide.

The supercritical fluid having a large diffusion coefficient enables diffusion into microgaps $2c$.

The size of "microgaps $2c$" (also referred to as a "free volume") existing in the resist film is measured by positron annihilation lifetime measurering method using low speed positron beam, and it is known that microgaps having a volume of 70 to 150 Å$^3$ (angstrom) are dispersed (Maclomecules, Vol. 32, pp. 1930, 1999).

On the other hand, the component (developer molecules) contained in a developer such as tetramethylammonium hydroxide (TMAH) has a size of about 100 Å$^3$, therefore there is formed the space into which a developer easily enter, and the space into which a developer does not easily enter.

As a result, a difference in a developing rate arises according to an area of molecular, thereby causing micro nonuniform development. This is a cause of pattern roughness.

To prevent the nonuniform development, a polymer film including uniform gaps may be synthesized. However, it is impossible to synthesize the polymer film including uniform gaps while controlling intermolecular entanglement, and thus such a problem cannot be solved in view of polymer synthesis.

According to the method of the present invention, it becomes possible to fill an low-molecular-weight organic matter into the gap larger than developer molecules (the gap of 100 to 150 Å$^3$ is filled using this method).

Figure 3A:
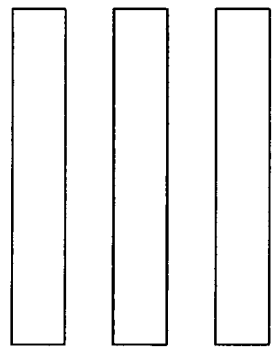
FIG. 3A is a schematic view showing an ideal pattern with reduced roughness.
Figure 3B:
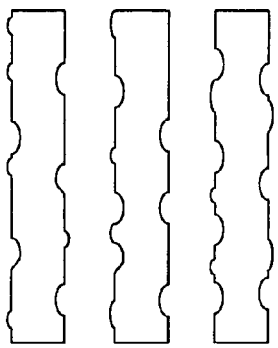
FIG. 3B is a schematic view showing a pattern with roughness.

As a result, it becomes possible to uniformly develop a resist polymer without a developer not penetrating into the space. As shown in FIG. 3A, an ideal pattern having reduced roughness (line-and-space pattern in this example) can be formed, and a problem such as roughness as shown in FIG. 3B, can be solved.

It is necessary that the size of the low-molecular-weight organic matter 4, which is used to fill the space into which developer molecules enter: microgaps $2c$, is the same as or smaller than that of microgaps into which developer molecules can enter. That is, the size of the organic matter is the same as or smaller than that of developer molecules. The organic matter preferably has nearly the same size as that of developer molecules.

On the other hand, it is more preferred that the organic matter 4 has the size enough to fill microgaps $2c$ and also has other functions.

For example, if the organic matter 4 serves as an acid generator component, a large amount of an acid generator component can be introduced while filling into microgaps $2c$. As a result, it is possible to realize an improvement in sensitivity, which has never been realized.

This introduction may be performed immediately before exposure, and also it is not required to preliminarily be contained in a resist solution. Therefore, it becomes possible to simultaneously satisfy storage stability as a resist solution and high sensitivity.

Similarly, when a material which can improve other properties of the resist, a dissolution inhibitor, and an etching resistance improver are also introduced, it becomes possible to improve pattern roughness and resist properties.

In the present specification and claims, "film" is not specifically limited as long as it can be formed on a substrate when a resist pattern is formed through a lithography technique, and the examples thereof are "organic antireflection film" and "resist film".

As used herein, concept of "organic antireflection film" includes the both of: (i) a film which itself has an ability of absorbing exposure light and is formed of a composition prepared by dissolving at least a "film forming component" and a so-called dye component indispensable to an organic antireflection film composition in an organic solvent; and (ii) a film which is formed of a composition prepared by dissolving at least a "film forming component" in an organic solvent and contains neither a component referred to as a so-called dye capable of absorbing exposure light indispensable to an organic antireflection film composition nor other optional additives.

Concept of "resist film" includes the both of: (i) a film which is formed of a composition prepared by dissolving at least "a film forming component" in an organic solvent and contains neither an acid generator which generates an acid under exposure component indispensable in a chemically amplified photoresist composition, a so-called photosensitive component such as quinonediazide ester indispensable in a non-chemically amplified resist composition, nor other optional additives; and (ii) a film which has a function of exhibiting properties in which the unexposed area and the exposed area differ in solubility in an alkali developer when exposed itself, and is formed of a composition prepared by dissolving a "film forming component", an acid generator, and a photosensitive component in an organic solvent.

Here, the "film forming component" means a component as a base which forms a film, and is preferably a resin.

The film subjected to supercritical processing may be a single-layered or multi-layered film.

It is preferable that the "antireflection film" is formed as a bottom layer of a resist film formed of a composition prepared by dissolving a film, preferably a film forming component, an acid generator, and a photosensitive component in an organic solvent.

(With Respect to a Material which Forms a Film)

The material used in the case of forming a "resist film" as a film will now be described in detail.

Specific examples of the material capable of constituting a composition used to form these films will now be described by way of specific examples of the positive resist composition.

As a composition used to form a film, a composition prepared by dissolving at least the following resin component (A) in an organic solvent (C) may be used. Other components such as acid generator component (B) can be also introduced in the later step [before the exposure step or before the development step (between the exposure step and the development step)] through supercritical processing.

The positive resist composition is prepared by dissolving a resin component (A) which has acid dissociable, dissolution inhibiting groups and exhibits increased alkali solubility under the action of an acid (base resin component), and an acid generator which generates an acid under exposure component (B) in an organic solvent (C).

In the positive resist composition, when the acid generated from the component (B) is reacted, acid dissociable, dissolution inhibiting groups contained in the component (A) are dissociated, and thus the entire component (A) shifts to an alkali soluble state from an alkali insoluble state.

Therefore, in the formation of a resist pattern, when a positive resist composition applied on a substrate is selectively exposed through a mask pattern, alkali solubility of the exposed area enhances, and alkali development can be performed.

As the positive resist composition, for example, it is possible to use a positive resist composition for ArF, which is proposed as a resist composition suited for a method of exposing using ArF excimer laser, and a positive resist composition for KrF, which is proposed as a resist composition suited for a method of exposing using KrF excimer laser.

The resin component (A) of the positive resist composition for KrF is commonly composed of a structural unit derived from hydroxystyrene, a structural unit derived from hydroxystyrene in which hydroxyl groups are substituted with acid dissociable, dissolution inhibiting groups and/or a structural unit derived from a (meth)acrylate ester having acid dissociable, dissolution inhibiting groups, while the resin component (A) of the positive resist composition for ArF is commonly composed of a resin having a structural unit derived from a (meth)acrylate ester having acid dissociable, dissolution inhibiting groups in a main chain.

Herein, a structural unit having a skeleton derived from (meth)acrylic acid in a main chain, such as a structural unit derived from (meth)acrylic acid or a structural unit derived from a (meth)acrylate ester is referred to as an "acryl structural unit". Also, a resin having an "acryl structural unit" is referred to as an "acryl-based resin".

If a resist composition using the "acryl-based resin" is used, the ecthing resistance tends to be decreased, and thus it is preferable that the present invention is applied to the resist composition, thereby introducing an etching resistance improver.

The present invention is applied to an "acryl based resin" in which the content of the "acryl structural unit" in the resin component is preferably 50 mol % or more, more preferably 80 mol % or more, and still more preferably 100 mol %. Since the resin component of such a type is widely used for ArF excimer laser, the present invention is preferably applied to an ArF excimer laser process, thereby introducing an etching resistance improver.

In the present specification, "(meth)acrylic acid" means either or both of methacrylic acid and acrylic acid, while "(meth)acrylate ester" means either or both of a methacrylate ester and an acrylate ester. A "structural unit" means a monomer unit constituting a polymer.

Resin Component (Film Forming Component) (A)

The component (A) can be used in combination with a plurality of monomer units having different functions, for example, the following structural units:

a structural unit having acid dissociable, dissolution inhibiting groups (hereinafter referred to as a first structural unit or a structural unit (a1)), a structural unit containing a lactone unit (hereinafter referred to as a second structural unit or a structural unit (a2)), a structural unit having an alcoholic hydroxyl group-containing polycyclic group (hereinafter referred to as a third structural unit or a structural unit (a3)), and a structural unit having a polycyclic group which is different from any of the acid dissociable, dissolution inhibiting groups of the first structural unit, a lactone unit of the second structural unit, and the alcoholic hydroxyl group-containing polycyclic group of the third structural unit (hereinafter referred to as a fourth structural unit or a structural unit (a4))

In the present specification, a "lactone unit" means a group in which one hydrogen atom is eliminated from a monocyclic or polycyclic lactone.

A structural unit (a1) is essential and structural units (a2) to (a4) can be appropriately used in combination according to required properties.

A structural unit (a1) may be used in combination with either a structural unit (a2) or (a3). A combination of structural units (a1), (a2), and (a3) is preferable among a low-molecular-weight organic matter used for filling microgaps 2c in view of ease of proceeding of the reaction with a crosslinking agent, which is described hereinafter as a preferable example, and also in view of etching resistance, resolution, and adhesion of a resist film with a substrate.

Furthermore, three kinds of the structural units preferably account for 80 mol % or more, and more preferably 90 mol % or more, of the component (A).

Furthermore, the component (A) preferably contains a structural unit (a4) because of excellent resolution from an isolation pattern to a semidense pattern (line-and-space pattern in which a space width is from 1.2 to 2 relative to a line width of 1).

Also, with respect to each of structural units (a1) to (a4), plural kinds may be used in combination.

First Structural Unit (a1)

A first structural unit (a1) of the component (A) may be a structural unit derived from a (meth)acrylate ester having acid dissociable, dissolution inhibiting groups, and may be a structural unit derived from hydroxystyrene in which hydroxyl groups are substituted with acid dissociable, dissolution inhibiting groups.

Acid dissociable, dissolution inhibiting groups in the structural unit (a1) can be used without any limitation as long as the groups have alkali dissolution inhibitory properties capable of making the entire component (A) to be alkali insoluble before exposure, and are dissociated under the action of an acid generated from the component (B) after exposure, thereby making the entire component (A) to be alkali soluble. Commonly, a group capable of forming a cyclic or chain tertiary alkyl ester with a carboxy group of (meth)acrylic acid or a hydroxyl group of hydroxystyrene, a tertiary alkoxycarbonyl group, or a chain alkoxyalkyl group is widely known as acid dissociable, dissolution inhibiting groups.

As the structural unit (a1), for example, a structural unit which has acid dissociable, dissolution inhibiting groups having a polycyclic group and is derived from a (meth)acrylate ester can be preferably used.

Examples of the polycyclic group include groups in which one or more hydrogen atoms are eliminated from bicycloalkane, tricycloalkane and tetracycloalkane. Specific examples thereof include groups in which one hydrogen atom is eliminated from a polycycloalkane such as adamantane, norbornane, isobornane, tricyclodecane or tetracyclododecane. The polycyclic group can be used by appropriately selecting from those proposed in an ArF resist. Among these, an adamantyl group, a norbornyl group and a tetracyclododecanyl group are preferable from an industrial point of view.

It also includes a tert-butyl group; a carboxy-tert-butyl group; a group in which the 1-position of cyclohexane is substituted with a linear or branched lower alkyl group having 1 to 6 carbon atoms and also one hydrogen atom is eliminated; and a cyclic acetal group such as a tetrahydropyranyl group and a tetrahydrofuranyl group.

As the structural unit (a1), for example, a structural unit derived from hydroxystyrene in which a hydroxyl group is substituted with an acid dissociable, dissolution inhibiting group can be preferably used.

Monomer units suited for the first structural unit (a1) are shown in the following formulas (I) to (III) and (a1-1) to (a1-11):

[Chemical Formula 2]

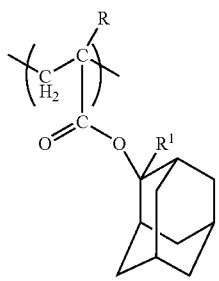

(I)

wherein R represents a hydrogen atom or a methyl group, and $R^1$ represents a lower alkyl group,

[Chemical Formula 3]

(II)

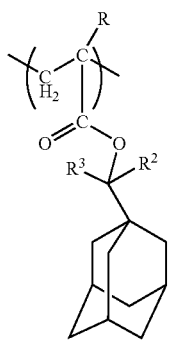

wherein R represents a hydrogen atom or a methyl group, and $R^2$ and $R^3$ each independently represents a lower alkyl group,

[Chemical Formula 4]

(III)

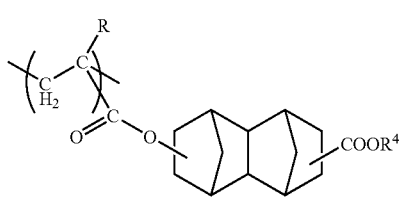

wherein R represents a hydrogen atom or a methyl group, and $R^4$ represents a tertiary alkyl group,

[Chemical Formula 5]

(a1-1)

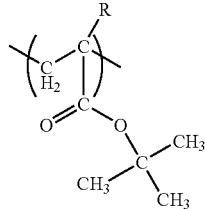

wherein R represents a hydrogen atom or a methyl group,

[Chemical Formula 6]

(a1-2)

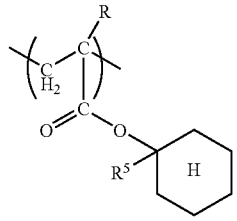

wherein R represents a hydrogen atom or a methyl group, $R^5$ represents a methyl group, and six-membered ring and H at the center of the six-membered ring represents cyclohexyl ring,

[Chemical Formula 7]

(a1-3)

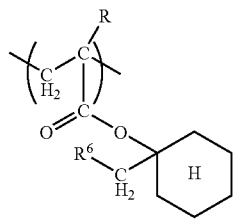

wherein R represents a hydrogen atom or a methyl group, $R^6$ represents a lower alkyl group, and six-membered ring and H at the center of the six-membered ring represents cyclohexyl ring,

[Chemical Formula 8]

(a1-4)

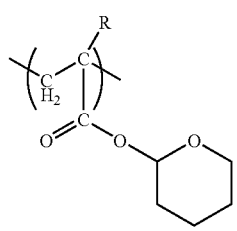

wherein R represents a hydrogen atom or a methyl group,

[Chemical Formula 9]

(a1-5)

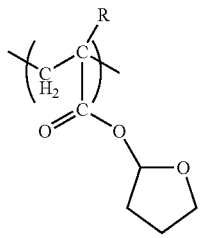

wherein R represents a hydrogen atom or a methyl group,

[Chemical Formula 10]

(a1-6)

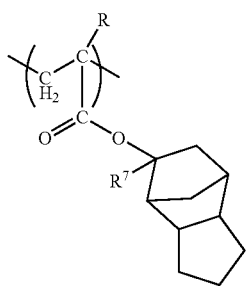

wherein R represents a hydrogen atom or a methyl group, and R$^7$ represents a lower alkyl group,

[Chemical Formula 11]

(a1-7)

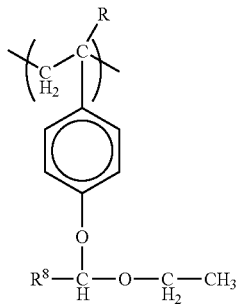

wherein R represents a hydrogen atom or a methyl group, and R$^8$ represents a lower alkyl group,

[Chemical Formula 12]

(a1-8)

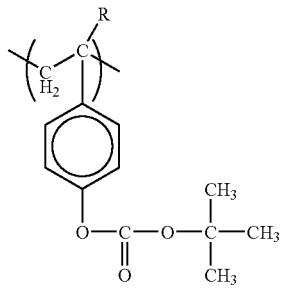

wherein R represents a hydrogen atom or a methyl group,

[Chemical Formula 13]

(a1-9)

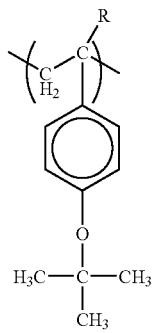

wherein R represents a hydrogen atom or a methyl group,

[Chemical Formula 14]

(a1-10)

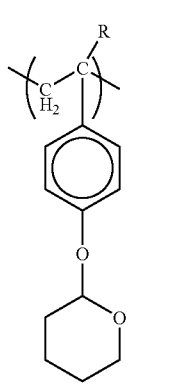

wherein R represents a hydrogen atom or a methyl group, and

[Chemical Formula 15]

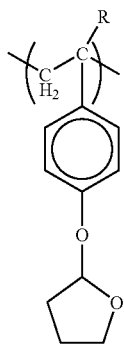
(a1-11)

wherein R represents a hydrogen atom or a methyl group.

$R^1$ to $R^3$ and $R^6$ to $R^8$ each independently is preferably a lower linear or branched alkyl group having 1 to 5 carbon atoms, and examples thereof include a methyl group, an ethyl group, a propyl group, an isopropyl group, an n-butyl group, an isobutyl group, a tert-butyl group, a pentyl group, an iso-pentyl group, and a neopentyl group. From industrial point of view, a methyl group or an ethyl group is preferable.

$R^4$ is a tertiary alkyl group such as a tert-butyl group or a tert-amyl group, and is preferably a group having 4 to 7 carbon atoms, and more preferably a tert-butyl group from an industrial point of view.

As the first structural unit (a1), structural units represented by the general formulas (I), (II) and (III) are particularly preferable because a resist pattern formed after the development treatment is excellent in resolution.

The structural unit (a1) can be used alone, or two or more kinds of them can be used in combination.

Second Structural Unit (a2)

The second structural unit (a2) of the component (A) has a lactone unit and is therefore effective to enhance adhesion between a resist film and a substrate and to enhance hydrophilicity with a developer.

As the structural unit (a2), any structural unit which have a lactone unit and is copolymerizable with the other structural unit of the component (A) can be used.

The monocyclic lactone unit includes, for example, a group in which one hydrogen atom is eliminated from γ-butyrolactone. Also, the polycyclic lactone unit includes, for example, a group in which one hydrogen atom is eliminated from a lactone-containing bicycloalkane.

As the structural unit (a2), a structural unit which has a lactone unit and is derived from a (meth)acrylate ester is preferably used.

Monomer units suited for a second structural unit (a2) are shown in the following formulas (a2-1) to (a2-3):

[Chemical Formula 16]

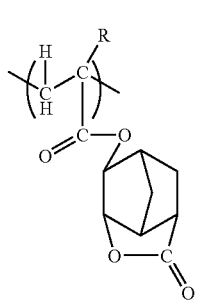
(a2-1)

wherein R represents a hydrogen atom or a methyl group,

[Chemical Formula 17]

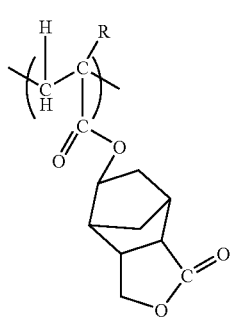
(a2-2)

wherein R represents a hydrogen atom or a methyl group,

[Chemical Formula 178]

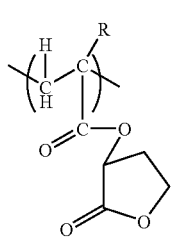
(a2-3)

wherein R represents a hydrogen atom or a methyl group

Among these, a γ-butyrolactone ester of (meth)acrylic acid having an ester bond in a carbon or a norbornanelactone ester represented by the formula (a2-1) or (a2-2) are preferably because is available from an industrial point of view.

The structural unit (a2) can be used alone, or two or more kinds of them can be used in combination.

Third Structural Unit (a3)

Since a hydroxyl group in an alcoholic hydroxyl group-containing polycyclic group in the third structural unit (a3) of as the component (A) is a polar group, by using the third structural unit (a3), hydrophilicity of the entire component (A) with a developer is enhanced and alkali solubility in the exposed area is improved. Therefore, the structural unit (a3) contributes to an improvement in resolution. Further, the structural unit (a3) is preferably used, because the hydroxyl group is more likely to be reacted with the crosslinking agent when the crosslinking agent is added as a low-molecular-weight organic matter used to fill microgaps 2c.

The polycyclic group in the structural unit (a3) can be used by appropriately selected from the same polycyclic groups as those exemplified in the description of the first structural unit (a1).

The alcoholic hydroxyl group-containing polycyclic group in the structural unit (a3) is not specifically limited, but a hydroxyl group-containing adamantyl group is preferably used.

Furthermore, this hydroxyl group-containing adamantyl group is preferably represented by the following general formula (IV) because it has the effect of increasing dry etching resistance and enhancing rectangularity of a pattern profile:

[Chemical Formula 19]

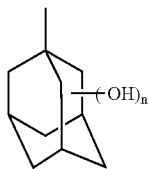

(IV)

wherein n represents an integer of 1 to 3.

As the third structural unit (a3), any structural unit which has the above-described alcoholic hydroxyl group-containing polycyclic group and can be copolymerized with the other structural unit of the component (A) can be used.

Particularly, a structural unit derived from a (meth)acrylate ester is preferable.

Specifically, a structural unit represented by the following general formula (IVa) is preferable:

[Chemical Formula 20]

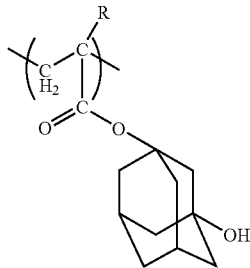

(IVa)

wherein R represents a hydrogen atom or a methyl group.

The structural unit (a3) can be used alone, or two or more kinds of them can be used in combination.

Fourth Structural Unit (a4)

In the fourth structural unit (a4), the polycyclic group which is different from any of "the acid dissociable, dissolution inhibiting groups, the lactone unit, and the alcoholic hydroxyl group-containing polycyclic group" means that, in the component (A), the polycyclic group of the structural unit (a4) does not overlap with any of acid dissociable, dissolution inhibiting groups of the first structural unit, the lactone unit of the second structural unit, and the alcoholic hydroxyl group-containing polycyclic group of the third structural unit, and also means that the structural unit (a4) does not possess any of acid dissociable, dissolution inhibiting groups of the first structural unit, the lactone unit of the second structural unit and the alcoholic hydroxyl group-containing polycyclic group of the third structural unit, which constitute the component (A).

As the polycyclic group in the structural unit (a4), any polycyclic group which is selected so as not to overlap with the structural unit used as the structural units (a1) to (a3) in one component (A) can be used, and is not specifically limited. For example, as polycyclic group in the structural unit (a4), the same polycyclic group as those exemplified as the structural unit (a1) can be used and it is possible to use those which have conventionally been known as an ArF positive resist material.

It is particularly preferable that the polycyclic group is at least one selected from a tricyclodecanyl group, an adamantyl group and a tetracyclododecanyl group because it is easily available from an industrial point of view.

As the structural unit (a4), any structural unit which has the above-described polycyclic group and can be copolymerized with the other structural unit of the component (A) can be used.

Preferable examples of the structural unit (a4) are shown in the following formulas (a4-1) to (a4-3):

[Chemical Formula 21]

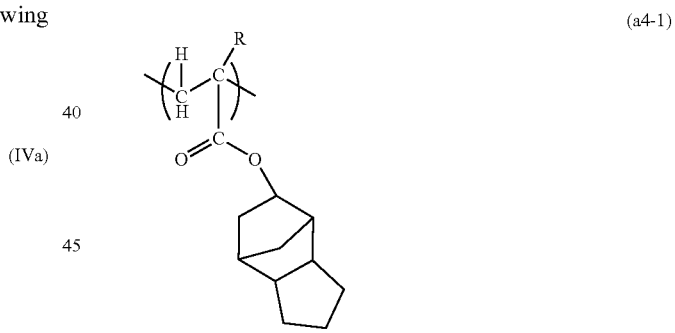

(a4-1)

wherein R represents a hydrogen atom or a methyl group,

[Chemical Formula 22]

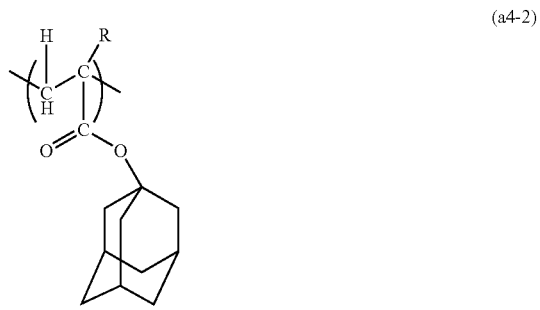

(a4-2)

wherein R represents a hydrogen atom or a methyl group, and

[Chemical Formula 23]

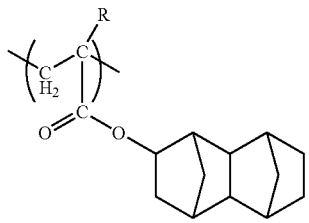

(a4-3)

wherein R represents a hydrogen atom or a methyl group.

The structural unit (a4) can be used alone, or two or more kinds of them can be used in combination.

As to the composition of the component (A), the content of the first structural unit (a1) is preferably from 20 to 60 mol %, and more preferably from 30 to 50 mol %, relative to the total structural units constituting the component (A), because excellent resolution is obtained.

Also, the content of the second structural unit (a2) is preferably from 20 to 60 mol %, and more preferably from 30 to 50 mol %, relative to the total structural units constituting the component (A), because excellent resolution is obtained.

Also, the content of the third structural unit (a3) is preferably from 5 to 50 mol %, and more preferably from 10 to 40 mol %, relative to the total structural units constituting the component (A), because excellent resist pattern shape is obtained. It is also preferable because hydroxyl groups of the structural unit (a3) react with a crosslinking agent which is a low-molecular-weight organic matter used to fill microgaps 2c, and the crosslinking reaction easily proceeds.

When the fourth structural unit (a4) is used, the content is preferably from 1 to 30 mol %, and more preferably from 5 to 20 mol %, relative to the total structural units constituting the component (A), because resolution from an isolation pattern to a semidense pattern is excellent.

A weight-average molecular weight (polystyrene equivalent value, the same shall apply hereinafter) of the resin component (A) is not specifically limited, and is preferably set within a range from 5,000 to 30,000, and more preferably from 8,000 to 20,000. When the weight-average molecular weight is more than the above range, solubility in a resist solvent may deteriorate. When the weight average molecular weight is less than the above range, a cross-sectional shape for the resulting resist pattern may become deteriorate.

The resin component (A) can be easily prepared by copolymerizing monomers corresponding to a structural unit (a1) as an essential component and the respective structural units (a2), (a3) and/or (a4) through known radical polymerization methods using a radical polymerization initiator such as azobisisobutyronitrile (AIBN). It is particularly preferred that the resin component (A) contains at least one kind selected from the above general formulas (I) to (III) as the structural unit (a1).

To adjust the content of the alkali-soluble unit in the component (A) to less than 20 mol %, the content of the monomer having the alkali-soluble unit is adjusted to less than 20 mol % relative to the entire monomer to be copolymerized.

The component (A) can be used alone, or two or more kinds of them can be used in combination.

Acid Generator Component (B)

The acid generator component (B) can be used by appropriately selecting from those which have conventionally been known as an acid generator in a chemically amplified photoresist.

As the acid generator, there are known various acid generators, for example, an onium salt-based acid generator such as iodonium salt or sulfonium salt; an oximesulfonate-based acid generator; a diazomethane-based acid generator such as bisalkyl or bisarylsulfonyldiazomethanes or poly(bissulfonyl)diazomethanes; a nitrobenzylsulfonate-based acid generator; an iminosulfonate-based acid generator; and a disulfone-based acid generator.

Among the diazomethane-based acid generator, specific examples of the bisalkyl or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Examples of the poly(bissulfonyl)diazomethanes include 1,3-bis(phenylsulfonyldiazomethylsulfonyl)propane (in the case of A=3), 1,4-bis(phenylsulfonyldiazomethylsulfonyl)butane (in the case of A=4), 1,6-bis(phenylsulfonyldiazomethylsulfonyl)hexane (in the case of A=6), 1,10-bis(phenylsulfonyldiazomethylsulfonyl)decane (in the case of A=10), 1,2-bis(cyclohexylsulfonyldiazomethylsulfonyl)ethane (in the case of B=2), 1,3-bis(cyclohexylsulfonyldiazomethylsulfonyl)propane (in the case of B=3), 1,6-bis(cyclohexylsulfonyldiazomethylsulfonyl)hexane (in the case of B=6), and 1,10-bis(cyclohexylsulfonyldiazomethylsulfonyl)decane (in the case of B=10), each having structures shown in the following formula (B1).

[Chemical Formula 24]

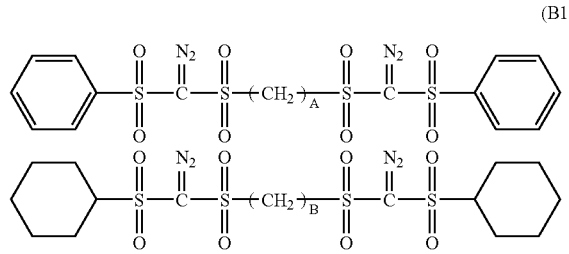

(B1)

Specific examples of the onium salt-based acid generator include trifluoromethane sulfonate or nonafluorobutane sulfonate of diphenyliodonium; trifluoromethane sulfonate or nonafluorobutane sulfonate of bis(4-tert-butylphenyl)iodonium; trifluoromethane sulfonate of triphenylsulfonium, heptafluoropropane sulfonate thereof, or nonafluorobutane sulfonate thereof; trifluoromethane sulfonate of tri(4-methylphenyl)sulfonium, heptafluoropropane sulfonate thereof, or nonafluorobutane sulfonate thereof; trifluoromethane sulfonate of dimethyl(4-hydroxynaphthyl)sulfonium, heptafluoropropane sulfonate thereof, or nonafluorobutane sulfonate thereof; trifluoromethane sulfonate of monophenyldimethylsulfonium, heptafluoropropane sulfonate thereof, or nonafluorobutane sulfonate thereof; trifluoromethane sulfonate of diphenylmonomethylsulfonium, heptafluoropropane sulfonate thereof, or nonafluorobutane sulfonate thereof; trifluoromethane sulfonate of (4-methylphenyl)diphenylsulfonium, heptafluoropropane sulfonate thereof, or nonafluorobutane sulfonate thereof; trifluoromethane sulfonate of (4-methoxyphenyl)diphenylsulfonium, heptafluoropropane sulfonate thereof, or nonafluorobutane sulfonate thereof; trifluoromethane sulfonate of tri(4-tert-butyl)phenylsulfonium, heptafluoropropane sulfonate thereof, or nonafluorobutane sulfonate thereof; and trifluoromethane sulfonate of diphenyl(1-(4-methoxy)naphthyl)sulfonium, heptafluoropropane sulfonate thereof, or nonafluorobutane sulfonate thereof.

As the component (B), one kind of acid generator may be used alone, or two or more kinds of acid generators may be used in combination.

The amount of the component (B) is adjusted within a range from 0.5 to 30 parts by mass, and preferably from 1 to 10 parts by mass, relative to 100 parts by mass of the component (A). When the amount is less than 0.5 parts by mass, a pattern is not sufficiently formed. On the other hand, when the amount is more than 30 parts by mass, it is difficult to obtain a uniform solution, and the deterioration of storage stability may be caused.

Organic Solvent (C)

The positive resist composition can be prepared by dissolving the component (A), the component (B), an optional component (D) described hereinafter, and the like in an organic solvent (C).

The organic solvent (C) may be any solvent which can dissolve the component (A) and the component (B) to give a uniform solution, and can be used by appropriately selecting one or more kinds from those which have conventionally been known as a solvent of a chemically amplified photoresist.

Examples of the organic solvent (C) include ketones such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, or monomethyl ether, monoethyl ether, monopropyl ether, monobutyl ether or monophenyl ether of dipropylene glycol monoacetate; propylene glycol monomethyl ether acetate (PGMEA), and propylene glycol monomethyl ether (PGME); cyclic ethers such as dioxane; esters such as methyl lactate, ethyl lactate, methyl acetate, ethyl acetate, butyl acetate, methyl pyruvate, ethyl pyruvate, methyl methoxypropionate, and ethyl ethoxypropionate; and lactones such as γ-butyrolactone. These organic solvents may be used alone, or as a mixed solvent of two or more kinds of solvents.

A mixed solvent prepared by mixing propylene glycol monomethyl ether acetate (PGMEA) with a polar solvent having a hydroxy group or lactone, such as propylene glycol monomethyl ether (PGME), ethyl lactate (EL) or γ-butyrolactone is preferable because storage stability of the positive resist composition is improved. In the case of mixing PGMEA with EL, a mass ratio PGMEA:EL is preferably from 1:9 to 9:1.

In the case of mixing PGMEA with PGME, a mass ratio PGMEA:PGME is preferably from 1:9 to 9:1, and more preferably from 2:8 to 8:2.

In the case of a component (A) containing all structural units (a1) to (a4), a mixed solvent of PGMEA and PGME is preferable, because storage stability of the positive resist composition is improved.

The component (C) is preferably a mixed solvent of at least one kind selected from among PGMEA and ethyl lactate (EL), and γ-butyrolactone. In this case, a mass ratio of the former to the latter is preferably from 70:30 to 95:5.

The component (C) can be used alone, or two or more kinds of them can be used in combination.

In the positive resist composition, the content of the organic solvent (C) is appropriately set according to the thickness of a resist film, so as to adjust the solid content of the resist composition within a range from 3 to 30% by mass.

Other Components

The positive resist composition can further contains (D) a nitrogen-containing organic compound as an optional component so as to improve resist pattern shape and post exposure stability of the latent images formed by the pattern-wise exposure of the resist layer. The nitrogen-containing organic compound is preferably a secondary lower aliphatic amine or a tertiary lower aliphatic amine, and is used as a quencher. Concept of the nitrogen-containing organic compound does not include an "etching resistance improver" described hereinafter.

Here, a lower aliphatic amine means an alkyl or alkyl alcohol amine of an alkyl or alkyl alcohol having 5 or less carbon atoms, and examples of the secondary or tertiary amine include trimethylamine, diethylamine, triethylamine, di-n-propylamine, tri-n-propylamine, tripentylamine, diethanolamine, and triethanolamine, among which an alkanolamine such as triethanolamine and triisopropanolamine is particularly preferable.

These amines are used alone or in combination.

The content of the component (D) is commonly within a range from 0.01% to 1.0% by mass relative to the component (A).

For the purpose of preventing deterioration of sensitivity caused by mixing of the component (D) and improving resist pattern shape and post exposure stability of the latent images formed by the pattern-wise exposure of the resist layer, the positive resist composition can further contain an acidic component as a component (E).

The component (E) includes an organic carboxylic acid, or a phosphorus oxo acid or derivative thereof. The component (D) and the component (E) can be used in combination, or either one can also be used alone.

Examples of suitable organic carboxylic acids include malonic acid, citric acid, malic acid, succinic acid, benzoic acid, and salicylic acid.

Examples of the phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, among which phosphonic acid is particularly preferable.

The component (E) can be used alone, or two or more kinds of them can be used in combination, and is used within a range from 0.01 to 5.0 parts by mass relative to 100 parts by mass of the component (A).

Other miscible additives can also be added to the positive resist composition of the present invention, if necessary, and examples thereof include additive resins for improving the properties of the resist film, surfactants for improving the applicability, dissolution inhibitors, plasticizers, stabilizers, colorants and halation prevention agents.

(With Respect to Materials Used in Supercritical Processing)

Materials used in supercritical processing will now be described.

A supercritical processing solution is prepared by dissolving an organic matter in a supercritical fluid.

The organic matter is a component to be introduced into a film through supercritical processing.

Supercritical Fluid

While carbon dioxide was used as the supercritical fluid in the above examples, any substance which has a critical temperature at which a resist film is not thermally deformed can be used as a supercritical fluid, whether the supercritical fluid is in the state of liquid or vapor at normal temperature under normal pressure. Commonly, a substance having a critical temperature of 100° C. or lower is preferable, and examples thereof include carbon dioxide, and a fluorine compound such as $SF_6$, $CHF_3$ or $CHF_2OCH_3$, which are in a state of vapor in an atmospheric environment and have the above critical temperature. Among these substances, carbon dioxide is preferable.

Also, the supercritical fluid is preferably a supercritical fluid which is vapor in an atmospheric environment and a supercritical fluid under predetermined temperature and pressure conditions. "Atmospheric environment" is an environment in a state which is commonly referred to as a normal atmosphere, for example, a state of an earth surface (land surface) pressure of 1013.25 hPa and a land surface temperature of 15° C.

The supercritical fluid to be used is preferably a fluid in which a critical temperature is 0° C. or higher, and a critical pressure is preferably from 50 MPa or less, particularly 40 MPa or less, and more preferably 30 MPa or less.

Specific examples thereof include, in addition to those listed above, $H_2O$, $C_3H_6$, $N_2O$, and a fluorine compound such as $CH_2F_5$.

A critical temperature (hereinafter sometimes referred to as Tc) and a critical pressure (hereinafter sometimes referred to as Pc) of the fluids described above are as follows.

$CO_2$: Tc=31.1° C., Pc=about 7.38 MPa (72.8 atm),
$H_2O$: Tc=374° C., Pc=about 22.0 MPa (217.6 atm),
$C_3H_6$: Tc=92.3° C., Pc=about 4.6 MPa (45.6 atm),
$N_2O$: Tc=36.5° C., Pc=about 7.27 MPa (71.7 atm),
$CHF_3$: Tc=25.9° C., Pc=about 4.84 MPa (47.8 atm),
$SF_6$: Tc=45.5° C., Pc=about 3.75 MPa,
$C_2HF_5$: Tc=66.3° C., Pc=about 3.62 MPa,
$CF_3CH_2OCH_3$: Tc=176° C., Pc=about 3.62 MPa, and
$CF_3CF_2OCH_3$: Tc=133.8° C., Pc=about 2.89 MPa Organic Matters The organic matter to be dissolved in the supercritical fluid will be described.

The organic matter is not specifically limited as long as it can be dissolved in a supercritical fluid.

In the organic antireflection film composition, the organic matter includes, for example, an etching resistance improver, and a so-called dye having a function capable of absorbing exposure light. As used herein, "dye" has not a conventional meaning and concept thereof includes any substance having properties which absorb "exposure light" and impart a function as an antireflection film.

In the resist composition, examples of the material of the non-chemically amplified resist composition include a photosensitive component and a sensitizer. In the chemically amplified photoresist composition, examples of the material include (B) the acid generator component, (D) the nitrogen-containing organic compound, and (E) the acidic compound component described above.

The concentration of the organic matter in the supercritical processing solution is not specifically limited as long as it can be dissolved in the supercritical fluid, and is from about 0.01% to 10% by mass, preferably from about 0.1% to 1% by mass, and typically from about 0.01% to 0.1% by mass, in the processing solution. The concentration of the organic matter relative to the resist film is preferably, for example, from about 10 to 20% by mass, and particularly about 20% by mass, so as to improve etching resistance.

As described above, the organic matter is preferably a low-molecular-weight substance. The molecular weight is preferably from 300 to 3,000, more preferably from 500 to 3,000, and still more preferably from 1,000 to 2,500.

Also, the low-molecular-weight substance preferably has nearly the same size as that of developer molecules. It is not necessary that entire microgaps are filled with the organic matter, and it is preferred to adjust the size so that developer molecules do not easily enter. Therefore, the size is preferably smaller than a maximum gap in the resist, for example, 150 $Å^3$.

The size is preferably a size capable of filling the gap of about 50 to 150 $Å^3$ in terms of volume, more preferably from about 50 to 120 $Å^3$, and still more preferably about 100 $Å^3$.

Also, the organic matter preferably contains at least one kind selected from the group consisting of an etching resistance improver, a catalyst, a nitrogen-containing organic compound, an acidic compound and a fullerene compound. Consequently, it is possible to impart other functions such as improved sensitivity and improved etching resistance, in addition to improved roughness.

The etching resistance improver preferably contains a crosslinking agent because etching resistance is more improved.

Furthermore, the catalyst preferably contains an acid generator which generates an acid under exposure because sensitivity can be improved as described above.

It is more preferred that these are low-molecular-weight substances.

Each component will now be described by way of specific examples.

Etching Resistance Improver

Examples of the etching resistance improver include so-called "crosslinking agent", which is mixed with a negative resist composition in a lithography technique.

The crosslinking agent can be used without any limitation as long as it has a functional group capable of causing the crosslinking reaction. Crosslinking means that the side chain of the crosslinking agent is crosslinked, thereby firming molecules. In this case, the crosslinking reaction includes a reaction between the crosslinking agent and materials constituting the film, or a reaction between the crosslinking agents. In this case, since the side chain moieties may be connected, the effect can be obtained even by the reaction between the crosslinking agents, even if the crosslinking agents do not react with the materials constituting the resist composition.

Specific examples of the crosslinking agent include aliphatic cyclic hydrocarbon having either or both of a hydroxy group and a hydroxyalkyl group, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane, or oxygen-containing derivative thereof.

The crosslinking agent also includes an amino-based crosslinking agent and a vinyl-based crosslinking agent.

It is preferred to use a crosslinking agent containing at least one kind selected from the group consisting of an amino-based crosslinking agent and a vinyl-based crosslinking agent.

The vinyl-based crosslinking agent is preferably a vinyl-based crosslinking agent having two or more vinyl groups, and particularly preferably a crosslinkable polyvinyl ether compound which has two or more vinyl group and an ether group.

Various polyvinyl ether compounds are described in Japanese Unexamined Patent Application, First Publication No. Hei 6-148889 and Japanese Unexamined Patent Application, First Publication No. Hei 6-230574, and can be used by optionally selecting from these compounds.

Among these compounds, preferable compound is a compound in which a portion or all of vinyl groups of an alcohol represented by the general formula (F-0-1):

$$R^0\text{—}(OH)_m \quad (F\text{-}0\text{-}1)$$

wherein $R^0$ represents a group in which m hydrogen atoms are eliminated from an alkane having a linear group, a branched group or a cyclic group, or a group in which m hydrogen atoms are eliminated from an aromatic ring, and m represents an integer of 2, 3 or 4,
are etherified with vinyl groups.

The number of carbon atoms of $R^0$ is preferably from 1 to 20.

In the "group in which m hydrogen atoms are eliminated from an aromatic ring", the aromatic ring includes a benzene ring and a naphthalene ring, among which a benzene ring is preferable.

Specific examples of the compound include ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexanedimethanol divinyl ether. Among these, a crosslinkable divinyl ether compound is more preferable and a cyclohexanedimethanol divinyl ether is particularly preferable.

A compound (F-1) described hereinafter is also preferable.

An amino-based crosslinking agent preferably has two or more structures derived from an amino group.

The amino-based crosslinking agent includes, for example, a compound obtained by reacting an amino group-containing compound such as melamine, acetoguanamine, benzoguanamine, urea, ethyleneurea, propyleneurea or glycol urile with formaldehyde or formaldehyde and a lower alcohol, to substitute hydrogen atoms of the amino group with a hydroxymethyl group or a lower alkoxymethyl group.

Among these crosslinking agents, a crosslinking agent using melamine is referred to as a melamine-based crosslinking agent, a crosslinking agent using urea is referred to as a urea-based crosslinking agent, a crosslinking agent using an alkyleneurea such as ethyleneurea or propyleneurea is referred to as an alkyleneurea-based crosslinking agent, and a crosslinking agent using glycol urile is referred to as a glycol urile-based crosslinking agent.

The crosslinking agent is preferably at least one kind selected from the group consisting of a melamine-based crosslinking agent, a urea-based crosslinking agent, an alkyleneurea-based crosslinking agent and a glycol urile-based crosslinking agent, among of which a glycol urile-based crosslinking agent is particularly preferable.

Examples of the melamine-based crosslinking agent includes a compound obtained by reacting melamine with formaldehyde to substitute hydrogen atoms of an amino group with hydroxymethyl groups, and a compound obtained by reacting melamine with formaldehyde and a lower alcohol to substitute hydrogen atoms of an amino group with lower alkoxymethyl groups. Specific examples thereof include hexamethoxymethylmelamine, hexaethoxymethylmelamine, hexapropoxymethylmelamine, and hexabutoxybutylmelamine, among which hexamethoxymethylmelamine is preferable.

Examples of the urea-based crosslinking agent include a compound obtained by reacting urea with formaldehyde to substitute hydrogen atoms of an amino group with hydroxymethyl groups, and a compound obtained by reacting urea with formaldehyde and a lower alcohol to substitute hydrogen atoms of an amino group with lower alkoxymethyl groups. Specific examples thereof include bismethoxymethylurea, bisethoxymethylurea, bispropoxymethylurea, and bisbutoxymethylurea, among which bismethoxymethylurea is preferable.

A compound (F-2) described hereinafter is also preferable.

The alkyleneurea-based crosslinking agent includes a group represented by the following general formula (F-0-2):

[Chemical Formula 25]

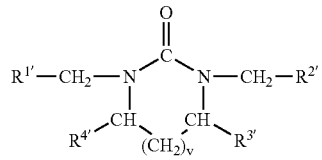

$$(F\text{-}0\text{-}2)$$

wherein $R^{1'}$ and $R^{2'}$ each independently represents a hydroxyl group or a lower alkoxy group, $R^{3'}$ and $R^{4'}$ each independently represents a hydrogen atom, a hydroxyl group or a lower alkoxy group, and v represents an integer of 0, 1, or 2.

When $R^{1'}$ and $R^{2'}$ are lower alkoxy groups, they are preferably alkoxy group having 1 to 4 carbon atoms, and may be linear or branched. $R^{1'}$ and $R^{2'}$ may be the same or different from each other, and are more preferably the same.

When $R^{3'}$ and $R^{4'}$ are lower alkoxy groups, they are preferably from alkoxy groups having 1 to 4 carbon atoms, and may be linear or branched. $R^{3'}$ and $R^{4'}$ may be the same or different from each other, and are more preferably the same.

v is an integer of 0, 1, or 2, and is preferably from 0 or 1.

The alkyleneurea-based crosslinking agent is particularly preferably a compound in which v is 0 (ethyleneurea-based crosslinking agent) and/or a compound in which v is 1 (propyleneurea-based crosslinking agent).

The compound represented by the general formula (F-0-2) can be obtained by the condensation reaction of an alkyleneurea with folmaldehyde, or can be obtained by reacting the above product with a lower alcohol.

Specific examples of the alkyleneurea-based crosslinking agent include an ethyleneurea-based crosslinking agent such as mono- and/or dihydroxymethylated ethyleneurea, mono- and/or dimethoxymethylated ethyleneurea, mono- and/or diethoxymethylated ethyleneurea, mono- and/or dipropoxymethylated ethyleneurea, or mono- and/or dibutoxymethylated ethyleneurea; a propyleneurea-based crosslinking agent such as mono- and/or dihydroxymethylated propyleneurea, mono- and/or dimethoxymethylated propyleneurea, mono- and/or diethoxymethylated propyleneurea, mono- and/or dipropoxymethylated propyleneurea, or mono- and/or dibutoxymethylated propyleneurea; 1,3-di(methoxymethyl) 4,5-dihydroxy-2-imidazolidinone; and 1,3-di(methoxymethyl)-4,5-dimethoxy-2-imidazolidinone.

The glycol urile-based crosslinking agent includes a glycol urile derivative in which N-position is substituted with either or both of a hydroxyalkyl group and an alkoxyalkyl group having 1 to 4 carbon atoms. Such a glycol urile derivative can be obtained by the condensation reaction of glycol urile and folmaldehyde, or reacting the above product with a lower alcohol.

Specific examples of the glycol urile-based crosslinking agent include mono-, di-, tri- and/or tetrahydroxymethylated glycol urile, mono-, di-, tri- and/or tetramethoxymethylated glycol urile, mono-, di-, tri- and/or tetraethoxymethylated glycol urile, mono-, di-, tri- and/or tetrapropoxymethylated glycol urile, mono-, di-, tri- and/or tetrabutoxymethylated glycol urile, and mono-, di-, tri-and/or tetrapentoxymethylated glycol urile.

A compound (F-3) described hereinafter is also preferable.

Also, the crosslinking agent preferably contains at least one kind selected from the group consisting of the following compounds (F-1), (F-2) and (F-3):

[Chemical Formula 26]

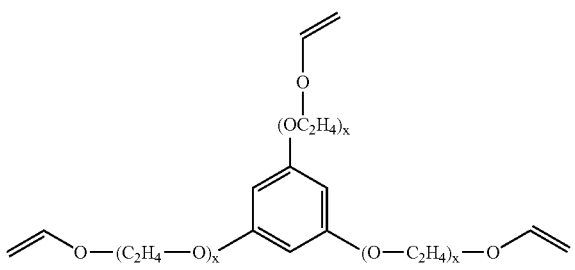

(F-1)

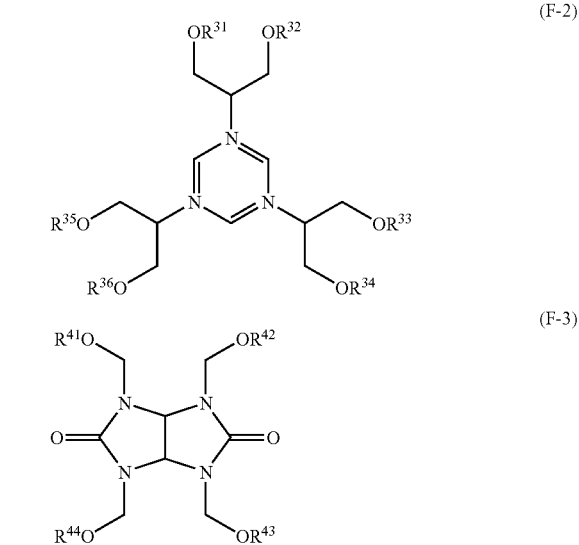

(F-2)

(F-3)

wherein x represents an integer of 0 to 2; $R^{31}$ to $R^{36}$ each independently represents an alkyl group having 5 or less carbon atoms; and $R^{41}$ to $R^{44}$ each independently represents an alkyl group having 5 or less carbon atoms.

In the compound (F-1), x is preferably 0.

Also, the compound (F-1) is preferably a compound represented by the following chemical formula (F-1-1).

[Chemical Formula 27]

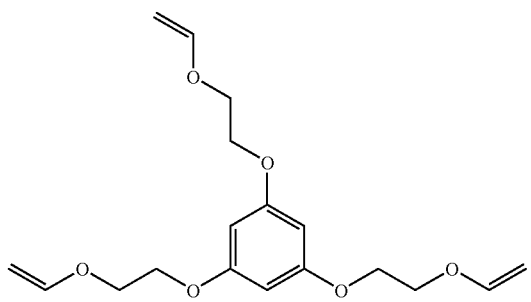

(F-1-1)

In the compound (F-2), $R^{31}$ to $R^{36}$ each independently represents an alkyl group having 5 or less carbon atoms which may be linear or branched. $R^{31}$ to $R^{36}$ may be the same or different from each other, and all of $R^{31}$ to $R^{36}$ are preferably the same. At least one of $R^{31}$ to $R^{36}$ is preferably a methyl group, and more preferably all of $R^{31}$ to $R^{36}$ are methyl groups.

In the compound (F-3), $R^{41}$ to $R^{44}$ each independently represents an alkyl group having 5 or less carbon atoms which may be linear or branched. $R^{41}$ to $R^{44}$ may be the same or different from each other, and all of $R^{41}$ to $R^{44}$ are preferably the same. At least one of $R^{41}$ to $R^{44}$ is preferably a methyl group, and more preferably all of $R^{41}$ to $R^{44}$ are more preferably methyl groups.

When the structure of the crosslinking agent contains a structure having plasma etching resistance, such as cyclic structure or conjugated double bond structure, etching resistance can be more improved. Compounds (F-1) to (F-3) are typical examples thereof.

The crosslinking agent listed above is composed of carbon, hydrogen and nitrogen atoms, but is not limited thereto. For example, the structure listed above may be partially substituted with fluorine or chlorine. Also, the structure listed above may have a group containing silicon such as $(CH_3)_3Si-$.

The crosslinking agent may be used alone, or two or more kinds of them may be used in combination.

Catalyst

The catalyst is preferably a substance which functions as a catalyst in the film. That is, a catalyst capable of playing a role of accelerating the reaction performed in the film.

The catalyst includes, for example, the component (B) which assists the dissociation reaction of acid dissociable, dissolution inhibiting groups of the component (A). It is preferred to mix, as a substance which assists proceeding of the crosslinking reaction, a catalyst together with a crosslinking agent. The catalyst which accelerates the crosslinking reaction includes, for example, an acid generator component (B) which generates an acid under exposure, and an acid generator component (B) is preferable.

Nitrogen-Containing Organic Compound

Examples of the nitrogen-containing organic compound include the same as those listed as the component (D).

Acidic Compound

Examples of the acidic compound include the same as those listed as the component (E).

Fullerene Compound

A carbon compound (fullerene compound) having a spherical conjugated bond structure known as fullerene is also preferable.

The fullerene compound, which has about 60 carbon atoms, is a molecule having a diameter of about 0.7 nm and has preferable size, considering the size of free volume.

The fullerene compound is also excellent in etching resistance.

In the present invention, the "fullerene compound" includes so-called fullerene composed only of carbon, derivative thereof in which metal such as Si, Al or Ti is introduced (coordinated) into a dome formed of the carbon chain, and derivative thereof in which a substituent such as functional group is incorporated into the carbon chain. For example, those described in Japanese Unexamined Patent Application, First Publication No. Hei 10-282649 are also used.

As a metal in the fullerene, the metal in fullerene which is commonly used in a semiconductor process is preferable in view of consistency with the process.

Examples of the substituent which is incorporated into the carbon chain in the fullerene includes a group capable of reacting with a functional group of a "film forming component".

For example, when the component (A) has a functional group such as an alcoholic hydroxyl group, a phenolic hydroxyl group or a carboxy group, a component having a functional group capable of reacting with the above functional group is preferable.

That is, the reaction of the functional group of the component (A) include "—OH+Cl—→—O—+HCl↑" and "—COOH+HOOC—→—C(=O)O(O=)C—+H$_2$O↑".

The phenolic hydroxyl group exists, for example, in a hydroxystyrene structural unit.

In a structural unit derived from a (meth)acrylate ester protected with acid dissociable, dissolution inhibiting groups, a portion of the dissolution inhibiting groups are converted into carboy groups by an exposure or heating process through separation of the dissolution inhibiting groups. The unreacted carboxy groups may be remained.

Also in the structural unit in which hydroxyl groups of the hydroxystyrene structural unit are protected with acid dissociable, dissolution inhibiting groups, a portion of the above groups protected with acid dissociable, dissolution inhibiting groups are converted into hydroxyl groups through separation of dissolution inhibiting groups. The unreacted hydroxyl groups may be remained.

Also, it is preferred to use the structural unit (a3) in view of reactivity.

Examples of the functional group (substituent) to be introduced into fullerene include a t-butoxy group, a chloromethyl group, and a bisazide group.

It is also possible to use a functional group used in a so-called crosslinking agent.

Fullerene in which a fluoropropyl group is introduced is also preferable.

A functional group having polarity, such as —OH, —COOH, or —COOCH$_3$ may also be introduced.

When fluorine or methylsilicon is introduced into an etching resistance improver such as fullerene compound, it becomes easy to dissolve in a supercritical fluid such as carbon dioxide.

In the fullerene compound, the following compound (F-4) is preferable.

[Chemical Formula 28]

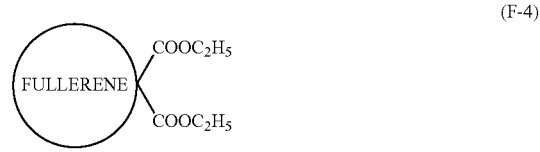

(F-4)

The fullerene compound has a function capable of absorbing exposure light such as ArF excimer laser beam and also play a role as a dye. Also, it exerts satisfactory effect of improving etching resistance.

Other Usable Low-Molecular-Weight Substance

As the low-molecular-weight substance other than those described above, it is possible to apply those which have conventionally been used in a resist composition.

Specific examples thereof include the followings.

That is, examples thereof include monomers (monomers corresponding to unit (a1) to unit (a4)) used in the component (A). One or more kinds of these monomers can be used, and can be appropriately used in combination according to the purposes.

Other examples include the followings.

The other monomer includes, for example, a quinonediazide ester represented by the following general formula (II-A):

[Chemical Formula 29]

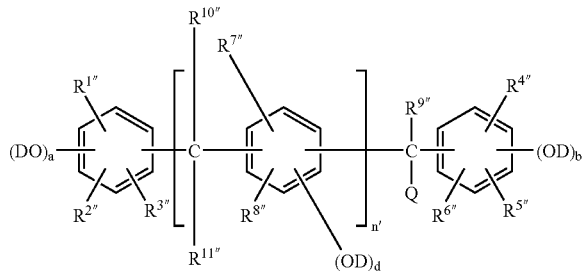

(II-A)

[wherein $R^{1''}$ to $R^{8''}$ each independently represents hydrogen atom, halogen atom, an alkyl group having 1 to 6 carbon atoms, an alkoxy group having 1 to 6 carbon atoms, or a cycloalkyl group having 3 to 6 carbon atoms; $R^{9'''}$ to $R^{11'''}$ each independently represents a hydrogen atom or an alkyl group having 1 to 6 carbon atoms; Q represents a hydrogen atom, an alkyl group having 1 to 6 carbon atoms, or may be combined with $R^{9'''}$ to form a cycloalkyl group having 3 to 6 carbon atoms, or a residue represented by the chemical formula (III-A):

[Chemical Formula 30]

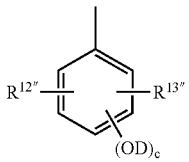

(III-A)

(wherein $R^{12''}$ and $R^{13''}$ each independently represents a hydrogen atom, a halogen atom, an alkyl group having 1 to 6 carbon atoms, an alkoxy group having 1 to 6 carbon atoms, or a cycloalkyl group having 3 to 6 carbon atoms; and c represents an integer of 1 to 3); D each independently represents a hydrogen atom or a 1,2-naphthoquinonediazide-5-sulfonyl group, and at least one represents a 1,2-naphthoquinonediazide-5-sulfonyl group; a and b each independently represents an integer of 1 to 3; d represents an integer of 0 to 3, and when a, b, or d is 3, $R^{3''}$, $R^{6''}$, or $R^{8''}$ is absent; and n' represents an integer of 0 to 3.] Specific examples of the quinonediazide ester include linear polyphenol compounds, for example, a linear three benzene ring type phenol compound such as 2,4-bis(3,5-dimethyl-4-hydroxybenzyl)-5-hydroxyphenol or 2,6-bis(2,5-dimethyl-4-hydroxybenzyl)-4-methylphenol; a linear four benzene ring type phenol compound such as bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, or bis[4-hydroxy-3-(2-hydroxy-5-methylbenzyl)-5-methylphenyl]methane; a linear five benzene ring type phenol compound such as 2,4-bis[2-hydroxy-3-(4-hydroxybenzyl)-5-methylbenzyl]-6-cyclohexylphenol, or 2,4-bis[4-hydroxy-3-(4-hydroxybenzyl)-5-methylbenzyl]-6-cyclohexylphenol; and a trisphenol-like polyphenol compound such as tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(2-methyl-4-hydroxy-5-cyclohexyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane, or bis(4-hydroxy-2,3,5-trimethylphenyl)-4-hydroxy-3-methoxyphenylmethane.

These compounds can also be used as a photosensitive component.

The low-molecular-weight substance also includes an alkali-soluble low-molecular-weight compound having a phenolic hydroxyl group of a molecular weight of 1,000 or less. The low-molecular-weight compound is not specifically limited and, for example, a polyphenol compound represented by the general formula (II-A) (wherein D is replaced by H) can be used. Preferable examples are 1-[1,1-bis(4-methylphenyl)ethyl]-4-[1-(4-hydroxyphenyl)isopropyl]benzene, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, and 1,1-bis(4-hydroxyphenyl)cyclohexane. Among these compounds, 1-[1,1-bis(4-methylphenyl)ethyl]-4-[1-(4-hydroxyphenyl)isopropyl]benzene, bis(4-hydroxy-2,3,5-trimethylphenyl)-2-hydroxyphenylmethane, bis(4-hydroxy-3,5-dimethylphenyl)-3,4-dihydroxyphenylmethane, 2,4-bis(3,5-dimethyl-4-hydroxyphenylmethyl)-6-methylphenol, and 4,6-bis[1-(4-hydroxyphenyl)isopropyl]resorcin are particularly preferable.

Preferred Combinations

The organic matters can be used alone or in combination.

In the present invention, it is preferred to contain at least a catalyst and an etching resistance improver as the organic matter. This is because a function of reacting the etching resistance improver with the component (A) can be accelerated by the catalyst.

A mass ratio of the etching resistance improver to the catalyst is preferably from 9:1 to 1:9, more preferably from 8:2 to 2:8, and most preferably about equivalent (for example, 6:4 to 4:6), in view of acceleration of the crosslinking reaction.

It is also preferred to contain at least a catalyst, an etching resistance improver, and a nitrogen-containing organic compound as the organic matter. This is because a function of reacting the etching resistance improver with the component (A) can be accelerated by the catalyst, and also the nitrogen-containing organic compound can prevent excess decomposition of acid dissociable, dissolution inhibiting groups in the resist composition, which is caused by an acid component generated excessively when the catalyst is an acid generator component.

It is also preferred to contain at least a catalyst, an etching resistance improver, a nitrogen-containing organic compound, and an acidic compound as the organic matter. This is also because the reaction of the etching resistance improver can be accelerated, and deterioration of a resist pattern shape can be prevented.

The organic matter can be used as it is or mixed with a "supercritical fluid", or a "supercritical precursor fluid" (hereinafter generically referred to as a "solvent" for convenience) in a liquid phase state before converting into a supercritical fluid, such as liquefied $CO_2$.

The organic matter can also be dissolved in a proper organic solvent and mixed with the "solvent".

The organic solvent can be used without any limitation as long as it can dissolve the crosslinking agent and, for example, a nonpolar solvent typified by hydrocarbon such as normal hexane, and a polar solvent such as ethyl alcohol can be used.

The organic matter is used as a "supercritical precursor processing solution" after mixing with a "supercritical precursor fluid". Alternatively, it is used as a "supercritical processing solution" after mixing with a "supercritical fluid". These solutions are sometimes referred generically to as a "processing solution". The concentration of the organic matter in the processing solution is not specifically limited as long as it can be dissolved in the supercritical precursor fluid or the supercritical fluid, and is from about 0.01 to 10% by mass, preferably from about 0.1 to 1% by mass, and particularly from about 0.01 to 0.1% by mass, relative to each processing solution. The concentration of the organic matter relative to the film (resist film or antireflection film) is about 20% by mass, and, if improved etching resistance is required, the concentration is from about 10 to 20% by mass, and particularly about 20% by mass.

Also, it is possible to mix one kind of an organic matter and the other kind of an organic matter with the "solvent", and then introduce them into the film.

When plural kinds of organic matters are used, these organic matters may be introduced simultaneously into the "solvent". Alternately, a processing solution containing one kind of an organic matter dissolved in the "solvent" and a processing solution containing the other organic matter dissolved in the "solvent" may be separately prepared according to the kind of the organic matter, and then the respective processing solutions may be introduced into a high pressure vessel described hereinafter in the high pressure vessel.

Also, the film 2 processed with the supercritical processing solution can also be subjected to a heat treatment, or irradiated with light and then subjected to a heat treatment, if necessary.

Consequently, the crosslinking reaction can be accelerated when the crosslinking agent is added.

This heat treatment can be performed utilizing the heat generated when brought into a supercritical state.

Figure 1D:
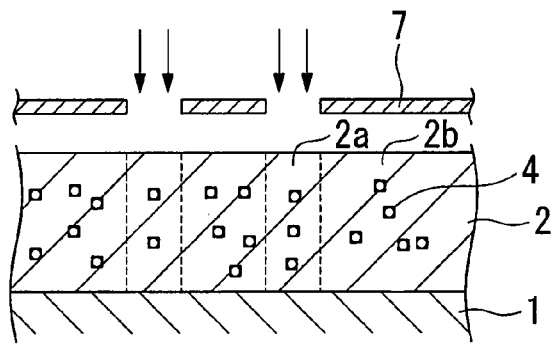

Then, as shown in FIG. 1D, the film 2 made of a positive resist composition is selectively exposed through a mask pattern 7 using an exposure apparatus. Consequently, the exposed area 2a and the unexposed area 2b are formed on the film 2.

As shown in FIG. 1D, this selective exposure includes exposure to the following exposure light through a mask pattern 7, irradiation with electron beam through a mask pattern, or drawing through electron beam without using a mask pattern.

Subsequently, post exposure baking (PEB) is performed. Consequently, the exposed area 2a becomes soluble in an alkali developer.

Then, a development treatment is performed.

Figure 1E:
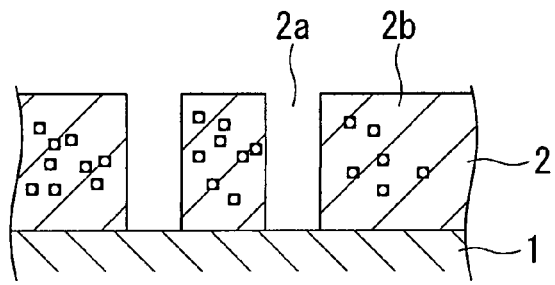

That is, a development treatment is performed using an alkali developer of an aqueous alkali solution, and then water rinsing is performed using pure water. In the case of water rinsing, for example, water is dropped or sprayed on the surface of the substrate while rotating the substrate, thereby washing out the developer and the resist composition dissolved by the developer on the substrate. Consequently, as shown in FIG. 1E, the film 2 of the positive resist composition is patterned into a shape corresponding to a mask pattern, and an undried resist pattern is obtained.

The above steps can be performed using a known technique. It is preferred that operation conditions are appropriately set according to the composition and properties of the resist composition to be used.

The light source used in exposure is not specifically limited, and the exposure can be performed using radiations such as ArF excimer laser, KrF excimer laser, $F_2$ excimer laser, EUV (Extreme Ultra Violet), VUV (Vacuum Ultra Violet), electron beam, X-ray and soft X-ray radiation. The positive resist composition of the above example is particularly effective for KrF excimer laser, ArF excimer laser, and electron beam. It is particularly preferred to apply when using a resist composition for ArF excimer laser process, which is inferior in etching resistance.

Between the substrate and the film of the resist composition, an organic or inorganic antireflection film can also be formed.

Water rising after the development treatment can be omitted, but an alkali component in an alkali developer is preferably washed out by performing a water rinsing step.

Then, using the resist pattern obtained as a mask, the substrate is etched by a conventional method.

After forming the film 2, supercritical processing can also be performed between the exposure step and the development treatment step.

Figure 4A:
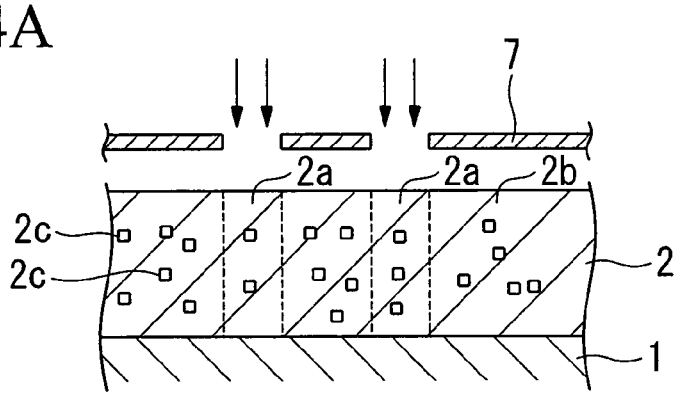
FIG. 4A to FIG. 4D are flow chart for explaining an example of a pattern forming method in the embodiment of the present invention.

FIG. 4A is a schematic view showing an operation in which the film 2 thus formed is selectively exposed through a mask pattern 7 to form the unexposed area 2b and the exposed area 2a.

Figure 4B:
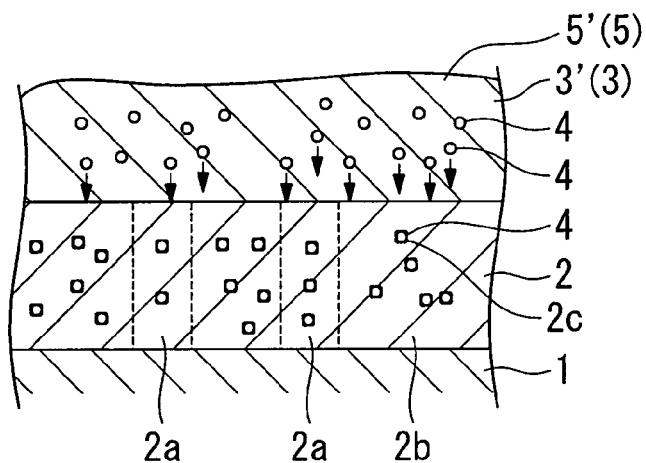
Figure 4C:
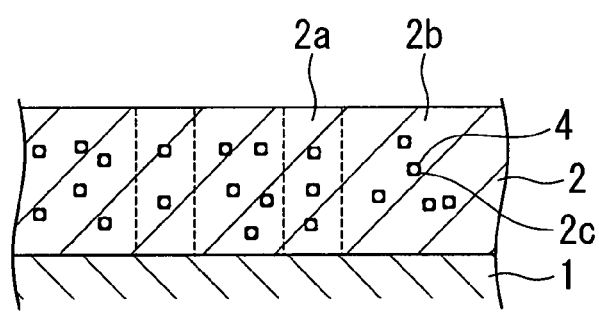

In the state where the exposed area 2a and the unexposed area 2b are formed, supercritical processing is performed as shown in FIG. 4B, and then a supercritical fluid 3' is expelled as shown in FIG. 4C to obtain a supercritically processed film 2.

Figure 4D:
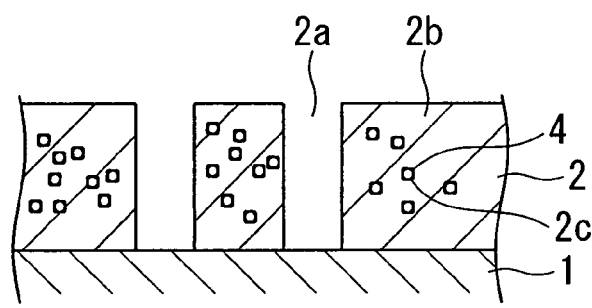

Then, as shown in FIG. 4D, the development treatment and, if necessary, the rinsing treatment are performed to obtain a resist pattern.

The method of the present invention may be applied to an organic antireflection film (BARC: Bottom Anti-Reflective Coating) formed between the resist and the substrate, in addition to the resist film.

For example, when an organic antireflection film (film) is formed on the substrate by a conventional method, and a dye is introduced into the film through supercritical processing, an organic antireflection film having improved antireflection performances can be obtained.

The film formed on the substrate may be subjected to supercritical processing, for example, by bringing the film into contact with a supercritical processing solution in the following manner.

The operation will be described by the following procedure with reference to FIG. 1A to FIG. 1C and FIG. 5.

Figure 5:
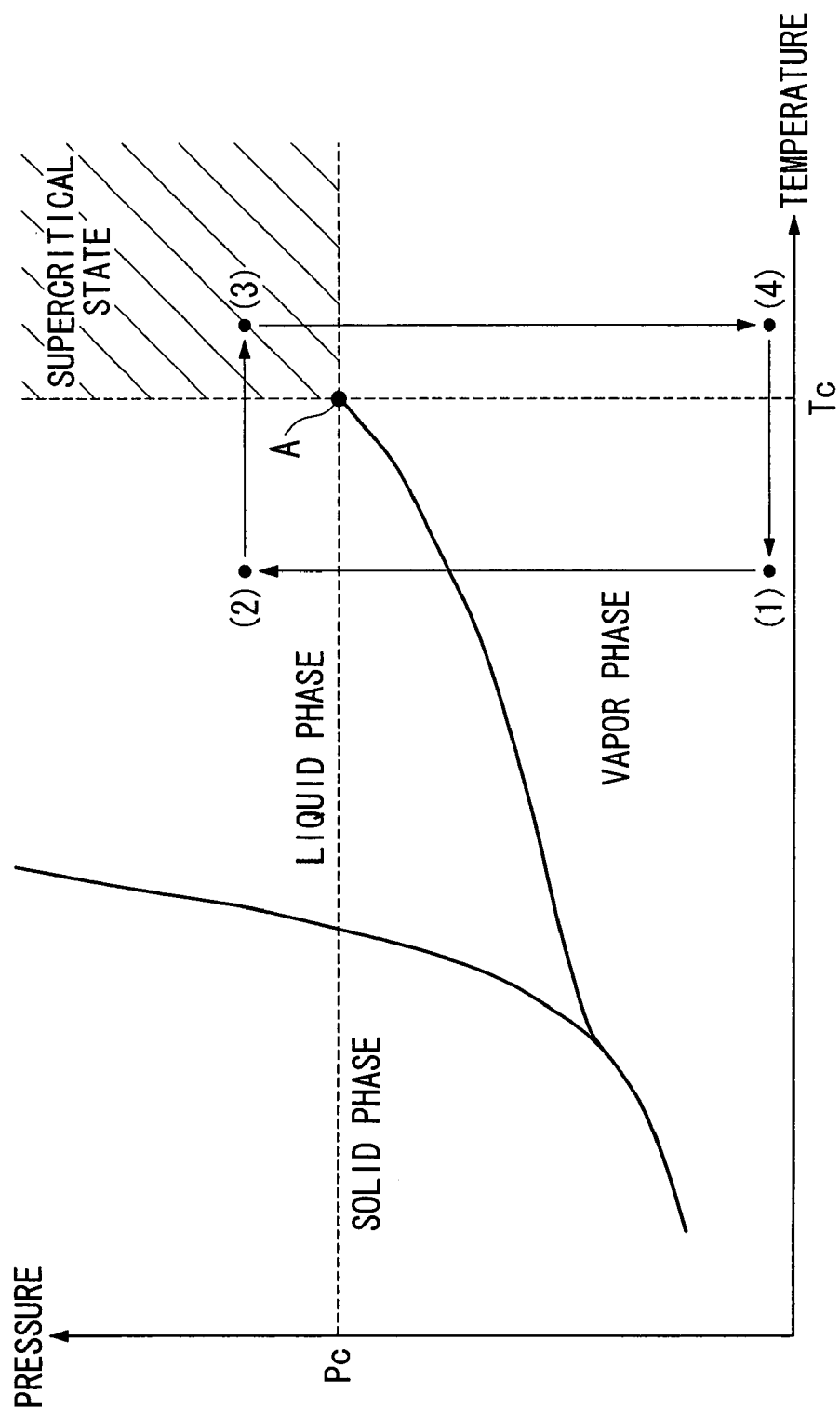
FIG. 5 is a graph showing schematically a vapor-liquid equilibrium curve of a fluid.

FIG. 5 is a graph showing schematically a vapor-liquid equilibrium curve of a fluid. In the figure, the point A denotes a critical point. In the case of carbon dioxide, it corresponds to a point of Tc=31.1° C. and Pc=7.38 MPa.

(1) First, a substrate 1 on which a resist pattern 2 is formed is placed in a high pressure vessel which can endure the temperature and the pressure enough to bring into a supercritical state, as shown in FIG. 1A.

Then, the high pressure vessel is closed air-tight. At this time, the temperature and the pressure in the high pressure vessel are brought into the state of room temperature (for example, 23° C.) and atmospheric pressure (point (1) in FIG. 5).

(2) Then, the temperature and pressure in the high pressure vessel are adjusted to the condition (for example, point (2) in FIG. 5) which brings $CO_2$ into a liquid phase, for example about 20 Pa. In this high pressure vessel, a supercritical precursor fluid, which is in the state of liquid phase before brought into a supercritical fluid and does not contain a crosslinking agent (for example, liquefied $CO_2$), is forcibly fed and also the residual atmosphere is discharged through a discharge section of the high pressure vessel. This operation is continued for about 5 minutes.

Consequently, the high pressure vessel is in a state of being filled with a supercritical precursor solution.

(3) Then, the interior of the high pressure vessel is brought into a supercritical state. Specifically, the interior of the high pressure vessel is once adjusted to the temperature and the pressure (for example, point (3) in FIG. 5, specifically, condition of 35° C. to 50° C. and 20 MPa) which brings the supercritical precursor fluid into a supercritical state.

In the case of using carbon dioxide, liquefied $CO_2$ in a liquid phase state can be brought into a supercritical state by adjusting the interior of the high pressure vessel to 31.1° C. or higher and 7.38 MPa or higher.

In the case of bringing the supercritical precursor fluid processing solution (supercritical precursor fluid processing solution for lithography process) in a liquid phase state into a critical state, it is preferred to bring into the supercritical state by adjusting the temperature to a critical temperature or higher and adjusting the pressure to a critical pressure or higher. Even if the supercritical precursor fluid is brought into a subcritical state closer to a supercritical state where the temperature is lower than the critical temperature and/or the pressure is less than the critical pressure, the same effect can be obtained.

(4) As shown in FIG. 1A, while maintaining a supercritical state, a supercritical precursor processing solution 5 prepared by dissolving an organic matter 4 in a supercritical precursor fluid 3 is introduced into the high pressure vessel.

As a result, the supercritical precursor processing solution 5 containing the organic matter 4 dissolved therein is filled in the vicinity of the film 2, the high pressure vessel is in a supercritical state, and thus this supercritical precursor processing solution 5 is converted into a supercritical processing solution 5' in which the organic matter 4 is dissolved in a supercritical fluid 3' in the high pressure vessel.

In such a manner, it is possible to bring the film 2 into contact with the supercritical processing solution 5' and to dip the film 2 in the supercritical processing solution 5'.

When allowed to stand for a predetermined time, as shown in FIG. 1B, the organic matter 4 in the supercritical processing solution 5' penetrates into the film 2.

(5) Next, when the pressure is gradually decreased as shown in FIG. 1C, the supercritical fluid 3' in the supercritical processing solution 5 is expelled from the high pressure vessel and then vaporized. Consequently, the pressure in the high pressure vessel decreases (for example, decreases to about 7.5 MPa), resulting in the temperature and the pressure indicated by the point (4) in FIG. 5. Therefore, the supercritical fluid 3' in the vicinity of the film 2 is removed in a vapor phase state, and the resist pattern is dried.

Then, the interior of the high pressure vessel is optionally cooled to room temperature.

Consequently, as shown in FIG. 1C, the organic matter 4 is introduced and the dispersed film 2 is obtained in a dried state.

In the case of performing a processing of decreasing the pressure in the high pressure vessel in the final stage of this supercritical processing, it is possible to perform a processing in which the organic matter 4 introduced preliminarily into the film 2 does not turn back to the exterior of the film 2.

This processing is effective when a large amount of the organic matter 4 is introduced.

For example, the following methods are performed.

(Method 1) As shown in FIG. 1B, an organic matter 4 is penetrated into a film 2. Then, a supercritical precursor fluid which does not easily dissolve the organic matter (hereinafter referred to as an "inert supercritical precursor fluid" for convenience) is introduced into the high pressure vessel, and also a supercritical processing solution 5' is discharged. As a result, the "inert supercritical precursor fluid" introduced into the high pressure vessel is brought into a fluid in a supercritical state (hereinafter referred to as an "inert supercritical fluid" for convenience). Consequently, the concentration of the organic matter 4 in the high pressure vessel can be decreased.

Then, the supercritical fluid is expelled and the pressure is lowered.

Consequently, since the "inert supercritical fluid" having comparatively low solubility of the organic matter 4 is filled in the vicinity of the film 2 into which the organic matter 4 is introduced, it is possible to prevent the organic matter 4 introduced into the resist pattern 2 from expelling from the film 2 again.

The "inert supercritical fluid" suited for these applications is preferably an inert gas such as helium, xenon or nitrogen, and particularly preferably helium, because solubility of the crosslinking agent is comparatively low, and a supercritical point is comparatively low as compared with carbon dioxide or a fluorine compound, and thus it is easily brought into a supercritical state.

Specifically, for example, as the "inert supercritical precursor fluid", helium pressurized to about 10 MPa to 20 MPa is introduced into the high pressure vessel, whereby, supercritical helium ("inert supercritical fluid") is filled in the high pressure vessel and the supercritical fluid 3' and excess organic matter 4 in the high pressure vessel are preferably discharged.

(Method 2) As shown in FIG. 1B, an organic matter 4 is penetrated into a film 2 and then the pressure in the high pressure vessel is reduced to the minimum pressure at which a supercritical state can be maintained.

Then, the same supercritical precursor fluid 3 as that used in the introduction of the organic matter 4 is introduced into the high pressure vessel in the state where the organic matter is not dissolved. This precursor solution is converted into a supercritical fluid 3' in the high pressure vessel.

The density of the supercritical fluid 3' in the high pressure vessel is decreased by adjusting to the minimum pressure. Consequently, solubility of the organic matter 4 can be decreased.

(Method 3) As shown in FIG. 1B, an organic matter 4 is penetrated into a film 2 and the inner temperature of the high pressure vessel was adjusted to a critical point or lower, and then the supercritical fluid 3' is expelled in a state of a supercritical precursor fluid 3.

(Method 2) and (Method 3) are simple and easy methods because a supercritical fluid which is different from that used in the case of introducing the organic matter 4, such as helium, is not used.

Also, the processing can be performed without using the supercritical precursor fluid.

That is, a supercritical fluid which is brought into a supercritical state outside the high pressure vessel is supplied to the high pressure vessel adjusted to the temperature and pressure conditions of a supercritical state.

The film 2 processed with the supercritical processing solution is optionally subjected to a heat treatment. Consequently, when a crosslinking agent is used as an etching resistance improver, the reaction between the crosslinking agent and the resin component (A), or the reaction between the crosslinking agents proceeds and thus etching resistance can be improved.

With respect to the heat treatment, the heating performed to bring into a supercritical state can be utilized. That is, in the process of the above supercritical processing, as shown in FIG. 1B to FIG. 1C, if the temperature conditions on which an organic matter 4 is introduced into a film 2 is the temperature condition which enables the crosslinking reaction to proceed, the step of the above supercritical processing and the crosslinking reaction can be simultaneously performed.

By enabling such a crosslinking reaction to proceed before expelling the supercritical processing solution 5' into the high pressure vessel, it is possible to prevent the organic matter 4 introduced into the film 2 from turning back to the exterior of the film 2 after introduction.

After the completion of the supercritical processing and the film 2 is dried, the crosslinking reaction may be performed in an atmospheric environment.

Heating condition is adjusted within a range from 80 to 140° C., preferably from 90 to 130° C., and particularly about 110° C.

Also, a heat treatment can also be performed, after irradiating with light

Light used for irradiation includes, for example, radiation such as ultraviolet ray having a wavelength of 500 nm or less, or far ultraviolet ray.

After processing of accelerating the crosslinking reaction, it is possible to prevent the organic matter 4 whose crosslinking reaction does not sufficiently proceeds from expelling from the film 2, by filling the high pressure vessel with the "inert supercritical fluid".

Second Embodiment

The second embodiment of the present invention will now be described.

Figure 6:
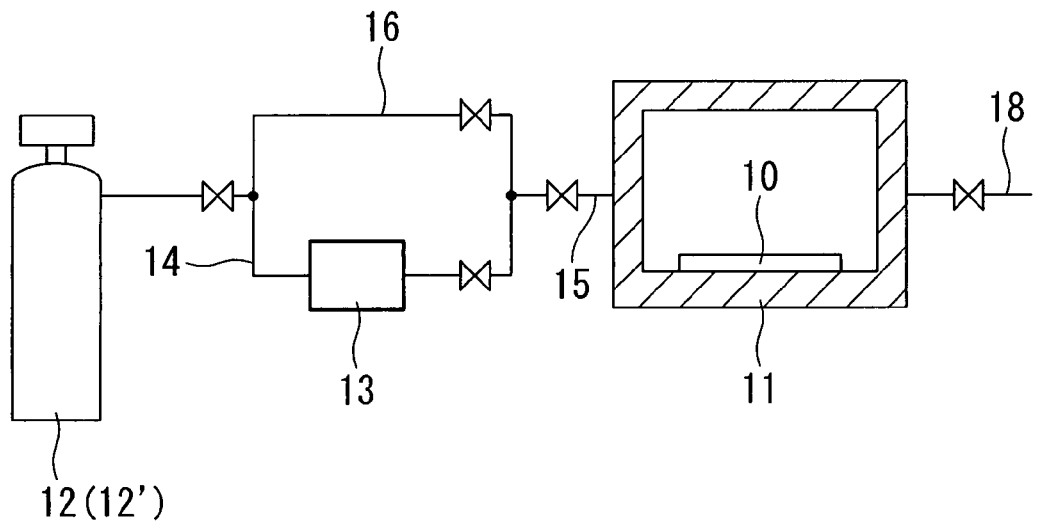
FIG. 6 is an explanatory view of an apparatus used in a method of the present invention.
Figure 7:
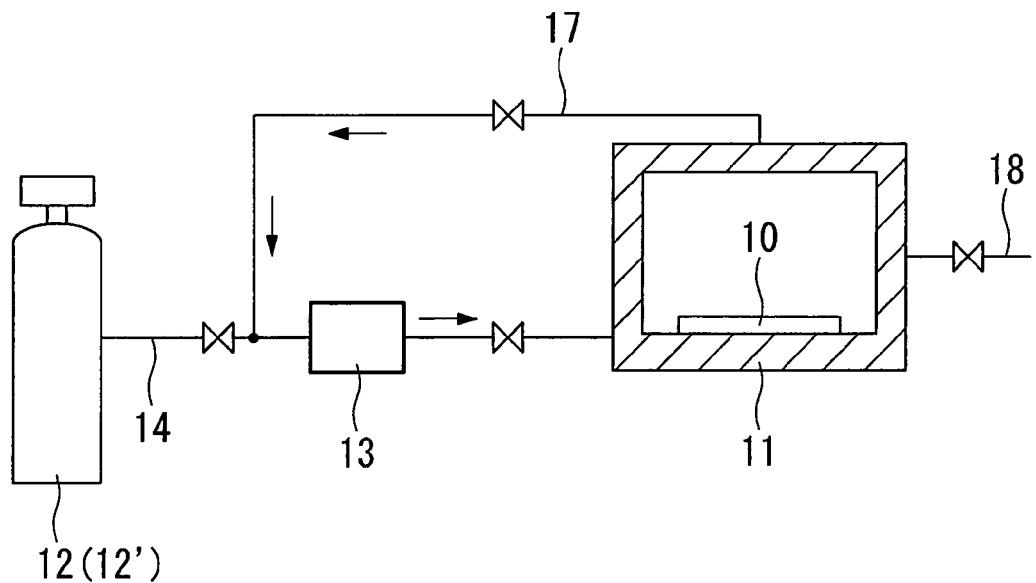
FIG. 7 is an explanatory view of another apparatus used in a method of the present invention.

The second embodiment is different from the first embodiment in the respect that, using apparatuses shown in FIG. 6 and FIG. 7, a supercritical processing solution prepared by mixing a supercritical fluid with an organic matter is directly supplied to the resist pattern.

The apparatus shown in FIG. 6 is equipped with a supercritical processing section 11 composed of a high pressure vessel, and a supercritical fluid supply system 12 which supplies a supercritical fluid. As the supercritical fluid supply system 12, for example, a cylinder of a supercritical fluid of carbon dioxide are used. The supercritical processing section 11 is equipped with a discharge passage 18.

A passage connected between the supercritical fluid supply system 12 and the supercritical processing section 11 is branched on the way of the upstream side, into two passages.

One of the branched passages is an organic matter supplying passage 14 with an organic matter supplying section 13, and the other is a direct supplying passage 16. The organic matter supplying passage 14 is incorporated with the direct supplying passage 16 again at the downstream side to form a supplying passage 15, which is connected with the supercritical processing section 11.

In the case of performing processing, first, the film 10 to be processed, which is obtained in the same manner as in the first embodiment, is carried in the supercritical processing section 11.

Then, when the supercritical fluid is supplied from the supercritical fluid supply system 12 to the direct supplying passage 16, only a supercritical fluid can be introduced into the supercritical processing section 11.

At this time, the supercritical processing section 11 is adjusted to temperature and pressure conditions which enable a supercritical state.

In such a way, the supercritical processing section 11 is filled with a supercritical fluid.

Then, when a supercritical fluid is supplied from the supercritical fluid supply system 12 to the organic matter supplying passage 14, organic matters are mixed in the organic matter supplying section 13 which is on the way to the supercritical processing section 11. In such a manner, the supercritical processing solution prepared by mixing the supercritical fluid with the organic matter is supplied to the supercritical processing section 11 through the supplying passage 15.

Consequently, the supercritical processing solution is filled in the vicinity of a film 10 in the supercritical processing section 11. Then, the organic matter is penetrated into the film.

The organic matter supplying section 13 can also be optionally heated so as to dissolve the organic matter.

It is also possible to use a supercritical precursor fluid supply system 12' in place of the supercritical fluid supply system 12. As the supercritical precursor fluid supply system 12', a cylinder filled with supercritical fluid precursor solution in a liquid phase state such as liquefied $CO_2$ is used.

In this case, a supercritical precursor fluid is introduced and filled from the supercritical precursor fluid supply system 12' to the supercritical processing section 11 through a direct supplying passage 16.

At this time, the supercritical processing section 11 is adjusted to temperature and pressure conditions on which the supercritical fluid is in a liquid phase.

Then, in the organic matter supplying passage 14, a supercritical precursor fluid obtained by mixing with an organic matter in the organic matter supplying section 13 is introduced and filled into the supercritical processing section 11.

Then, the supercritical processing section 11 is adjusted to temperature and pressure conditions which enable a supercritical state, and the organic matter is penetrated into the film 10.

The apparatus shown in FIG. 6 may have plural organic matter supplying passages 14 equipped with an organic matter supplying section 13 in parallel so as to introduce plural crosslinking agents after mixing.

In the apparatus shown in FIG. 7, a supercritical fluid supply system 12 and a supercritical processing section 11 are connected through an organic matter supplying passage 14 equipped with an organic matter supplying section 13. The supercritical processing section 11 is equipped with a circulating passage 17, and the other end is connected with the upstream side of the organic matter supplying section 13 of the organic matter supplying passage 14.

The supercritical processing solution supplied to the supercritical processing section 11 is extracted at the circulating passage 17 and returned to the organic matter supplying passage 14, and thus supercritical processing solution circulates.

In this apparatus, since the supercritical processing solution is circulated by the circulating passage 17, the concentration of the organic matter in the supercritical processing solution can be stabilized.

In performing the processing, a supercritical fluid is supplied to the organic matter supplying passage 14 from the supercritical fluid supply system 12. As a result, the supercritical fluid is mixed with an organic matter at the organic matter supplying section 13 to obtain a supercritical processing solution, which is supplied to the supercritical processing section 11.

At this time, the supercritical processing section 11 is adjusted to temperature and pressure conditions which enable a supercritical state.

Consequently, the supercritical processing solution is filled in the vicinity of the film 10 in the supercritical processing section 11. Then, the organic matter is penetrated into the film 10.

Similar to the apparatus shown in FIG. 6, a supercritical precursor fluid supply system 12' can also be used in place of the supercritical fluid supply system 12. That is, after introducing the precursor processing solution into the supercritical processing section 11, the supercritical processing section 11 is brought into a supercritical state, thereby making it possible to penetrate the organic matter into the film 10.

Similar to the apparatus shown in FIG. 6, a supercritical precursor fluid supply system 12' can also be used in place of the supercritical fluid supply system 12.

The apparatus shown in FIG. 7 may have plural organic matter supplying passages 14 equipped with an organic matter supplying section 13 in parallel so as to introduce plural organic matters after mixing.

<Supercritical Processing Solution for Lithography Process>

The supercritical processing solution for lithography process (hereinafter referred to as a "supercritical processing solution") in the present invention is prepared by dissolving an organic matter in a substance serving as a supercritical fluid, followed by enclosing them in a high pressure vessel, and preferable is the supercritical processing solution for lithography process prepared by dissolving a predetermined amount of an organic matter in a substance serving as a supercritical fluid, followed by enclosing them in a movable high pressure vessel for storage.

Examples of the "movable high pressure vessel for storage" include a tank and a cylinder which can endure high pressure enough to bring into a supercritical state or a liquid phase state before being brought into a supercritical state.

In the "supercritical processing solution for lithography process" of the present specification and claims, concept the "substance serving as a supercritical fluid" includes both of a "supercritical fluid" and a "fluid in a liquid phase state before being brought into a supercritical state".

As the organic matter, the same organic matters as those explained in the above resist pattern forming method can be used.

That is, the organic matter is preferably a low-molecular-weight substance.

Also, the organic matter preferably contains at least one kind selected from the group consisting of an etching resistance improver, a catalyst, a nitrogen-containing organic compound, an acidic compound, and a fullerene compound.

Furthermore, the etching resistance improver preferably contains a crosslinking agent.

Such a supercritical processing solution is suited for use in the resist pattern forming method of the present invention.

Also, in the supercritical processing solution for lithography process, the "substance serving as a supercritical fluid" is preferably carbon dioxide.

This supercritical processing solution can be prepared, for example, by dissolving an organic matter in a supercritical fluid, and then by filling a "movable high pressure vessel for storage" such as a cylinder with the above solution.

In the above <resist pattern forming method>, it was explained that an organic matter is charged in a tank connected to a high pressure vessel, and then a supercritical fluid, or a substance (supercritical precursor fluid) in a liquid phase state, which serves as the supercritical fluid, is introduced, thereby dissolving the organic matter. In this case, the method of the present invention can be carried out without causing any problem, but it always costs much labor to put the organic matter in the tank.

On the other hand, when a large amount of the organic matter is put in a "movable high pressure vessel for storage" such as a cylinder (a tank), the concentration is high in an initial stage. The concentration decrease in the stage where an etching resistance improver is consumed from the tank. To solve such a problem, a supercritical processing solution containing a predetermined amount of an etching resistance improver and a predetermined amount of an acid generator dissolved in a supercritical precursor fluid is preferably prepared.

For example, a constant concentration of an organic matter represented by the above chemical formula (1) is dissolved in a cylinder containing liquefied carbon dioxide.

When used, a "movable high pressure vessel for storage" such as a cylinder described above is moved and installed, attached to a high pressure vessel, and then a supercritical fluid can be introduced into a high pressure vessel in which a substrate is directly placed.

According to this method, a supercritical processing solution having a constant concentration can be always supplied until the supercritical processing solution in the "movable high pressure vessel for storage" such as a cylinder is consumed, and thus it becomes possible to perform processing without causing any variation in concentration.

The supercritical processing solution for lithography process is prepared by preliminarily mixing a supercritical fluid with an organic matter, but may be prepared by collecting a waste gas emitted from a high pressure vessel, followed by purification and mixing again.

EXAMPLES

[Resist Composition]
A Resist Composition Including an Acryl-based Resin

Using a resist composition for ArF excimer laser including an acryl-based resin composed of the following components (hereinafter sometimes referred to as an "ArF resist), the following test was performed, and the effect of the present invention was confirmed.

Resin component (A): 100 parts by mass
A resin of the following chemical formula (V) was used. A molar ratio p:q:r is 4:4:2.

[Chemical Formula 31]

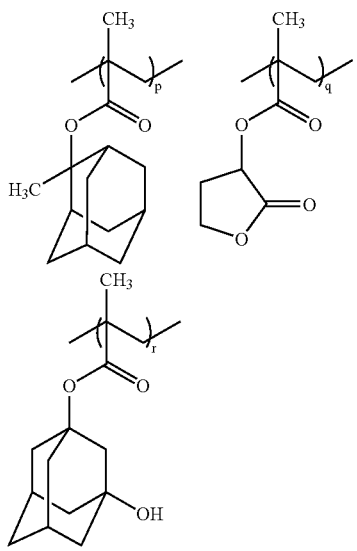

Component (B)
2.5 parts by mass relative to 100 parts by mass of the component (A)
Substance name: triphenylsulfonium nonafluorobutane sulfonate Component (D)
0.2 parts by mass relative to 100 parts by mass of the component (A) Substance name triethanolamine The above components were dissolved in propylene glycol monomethyl ether acetate, as a component (C), to prepare a resist composition having a solid content of about 8% by mass.

In the case of Example 2, a composition excluding the component (B) was used.

In the case of Example 3, a composition prepared by dissolving the component (A) in the component (C) was used.

Example 1

First, an organic antireflection film ARC29 (trade name, manufactured by Brewer Science, Inc.) was formed with a thickness of 77 nm on a silicon substrate.

Then, an ArF resist was spin-coated at 130° C. for 90 seconds to form a 300 nm thick resist film.

The substrate was placed in a high pressure vessel, and the vessel was closed air-tight. The temperature in the vessel was adjusted to 50° C. A processing solution prepared by dissolving a compound represented by the above chemical formula (1), as an organic matter, in supercritical carbon dioxide was introduced into the high pressure vessel.

Using a pump, the processing solution was forcibly fed in the vessel, thereby adjusting the pressure to 15 MPa, and then this state was maintained for 5 minutes.

After evacuation, the substrate was taken out from the high pressure vessel, and the resist film was subjected to exposure of a predetermined pattern image using ArF excimer laser as a light source, subjected to post exposure baking at 130° C. for 90 seconds, and then developed with an aqueous 2.38 mass % TMAH (tetramethylammonium hydroxide) solution at 23° C. to form a resist pattern.

As a result, a line-and-space pattern having a width of 90 nm with less roughness could be formed.

Example 2

On a silicon substrate, an ArF resist containing no acid generator was spin-coated to form a 200 nm thick resist film. Then, the substrate was placed in the high pressure vessel, and the vessel was closed air-tight.

The temperature in the vessel was adjusted to 35° C.

A processing solution prepared by dissolving an acid generator component (triphenylsulfonium nonafluorobutane sulfonate) composed of a sulfonate salt, as an organic matter, in supercritical carbon dioxide was introduced into the high pressure vessel.

Using a pump, the processing solution was forcibly fed in the vessel, thereby adjusting the pressure to 20 MPa, and then this state was maintained for 5 minutes.

At this time, the acid generator component can be filled in the amount which is twice more than that which is added as a conventional resist material.

After evacuation, the substrate was taken out from the high pressure vessel. Then, the resist film was subjected to exposure of a predetermined pattern image using ArF excimer laser as a light source, subjected to post exposure baking at 130° C. for 90 seconds, and then developed with an aqueous 2.38 mass % TMAH (tetramethylammonium hydroxide) solution at 23° C. to form a resist pattern.

As a result, a pattern having a width of 90 nm and having sensitivity twice higher than that of a conventional ArF resist could be formed.

Example 3

On a silicon substrate, an acryl-based resin was spin-coated to form a 200 nm thick polymer resin film.

The substrate was placed in the high pressure vessel, and the vessel was closed air-tight. The temperature of the vessel was adjusted to 85° C.

A processing solution prepared by dissolving an acid generator component composed of a sulfonium salt (triphenylsulfonium nonafluorobutane sulfonate), a crosslinkable polyvinyl ether compound (the formula (F-1-1)), and a nitrogen-containing compound (triethanolamine) [component (D)] in supercritical carbon dioxide was introduced into the high pressure vessel.

Using a pump, the processing solution was forcibly fed in the vessel, thereby adjusting the pressure to 20 MPa, and then this state was maintained for 10 minutes.

At this time, these resist components can be filled in the amount twice more than that which is added as a conventional resist material.

After evacuation, the substrate was taken out from the high pressure vessel. Then, the polymer resin film was subjected to exposure of a predetermined pattern image using ArF excimer laser as a light source, subjected to post exposure baking at 130° C. for 90 seconds, and then developed with an aqueous 2.38 mass % TMAH (tetramethylammonium hydroxide) solution at 23° C. to form a resist pattern.

As a result, a resist pattern having high sensitivity, high resolution, and high etching resistance could be formed.

Example 4

An example of subjecting an organic antireflection film to supercritical processing will now be described.

First, an antireflection film (ARC29 (manufactured by Brewer Science, Inc.)) composed of an organic film was formed on a silicon substrate with a thickness of 200 nm.

The silicon substrate was placed in a closed vessel which can endure a high pressure (high pressure vessel), and the vessel was closed air-tight.

The temperature of the vessel was adjusted to 35° C. Then, a processing solution prepared by dissolving the above fullerene derivative (F-4) as an etching substance in supercritical carbon dioxide was introduced into the closed vessel.

Using a pump, the processing solution was forcibly fed in the vessel, thereby adjusting the pressure to 20 MPa, and then this state was maintained for 5 minutes.

By these steps, it was converted into a state where the fullerene derivative is uniformly introduced into the antireflection film.

Then, the pressure in the closed vessel was gradually decreased to an atmospheric pressure.

As a result, it was possible to obtain a high functional antireflection film which has never been obtained, having an high antireflection effect and high etching resistance, enhanced by incorporation of the fullerene derivative.

Then, an ArF resist was spin-coated to form a 500 nm thick resist film. The resist film thus formed was subjected to exposure of a predetermined pattern image using ArF excimer laser as a light source, subjected to post exposure baking at 130° C. for 90 seconds, and then developed with an aqueous 2.38 mass % TMAH (tetramethylammonium hydroxide) solution at 23° C. to form a satisfactory resist pattern.

Example 5

An example of a process using a supercritical processing solution for lithography process will now be described.

First, an organic antireflection film ARC29 (manufactured by Brewer Science, Inc.) was formed on a silicon substrate with a thickness of 77 nm.

Then, an ArF resist was spin-coated and heated at 130° C. for 90 seconds to form a 300 nm thick resist film.

The substrate was placed in a closed vessel, and the vessel was closed air-tight. The temperature of the vessel was adjusted to 50° C.

On the other hand, a liquefied carbon dioxide containing 10 mass % of a nitrogen-containing organic compound (triethanolamine) dissolved therein was introduced into a cylinder, followed by enclosing it.

Using a pump, a processing solution prepared by dissolving the nitrogen-containing organic compound in liquefied carbon dioxide was forcibly fed in the high pressure vessel, thereby adjusting the pressure to 15 MPa, and thus the carbon dioxide is converted to supercritical state. Then, this state was maintained for 5 minutes.

After evacuation, the substrate was taken out from the high pressure vessel. Then, the resist film was subjected to exposure of a predetermined pattern image using ArF excimer laser as a light source, subjected to post exposure baking at 130° C. for 90 seconds, and then developed with an aqueous 2.38 mass % TMAH (tetramethylammonium hydroxide) solution at 23° C. to form a resist pattern.

As a result, a line-and-space pattern having a width of 90 nm with less roughness could be formed.

INDUSTRIAL APPLICABILITY

According to the present invention, it is possible to provide a fine and high-accuracy pattern, which is also excellent in either or both of high sensitivity and etching resistance.

The invention claimed is:

1. A resist pattern forming method, which comprises the steps of:
    providing a single- or multi-layered film on a substrate;
    forming a resist pattern on the film through a lithography technique including exposure and development; and
    performing supercritical processing in which the film is brought into contact, before the exposure, with a supercritical processing solution in which an organic matter of at least one material selected from the group consisting of an etching resistance improver, a catalyst, a nitrogen-containing organic compound, an acidic compound, and a fullerene compound is dissolved.

2. The resist pattern forming method according to claim 1, wherein the organic matter comprises a low-molecular-weight substance.

3. The resist pattern forming method according to claim 2, wherein the low-molecular-weight substance has nearly the same size as that of developer molecules contained in a developer.

4. The resist pattern forming method according to claim 1, wherein the etching resistance improver comprises a crosslinking agent.

5. The resist pattern forming method according to claim 1, wherein the catalyst comprises an acid generator which generates an acid under exposure.

6. The resist pattern forming method according to claim 1, wherein the film is formed by using an acryl-based resin.

7. The resist pattern forming method according to claim 1, wherein a bottom layer of the film is formed by using a resin to serve as an antireflection film for exposure.

8. The resist pattern forming method according to claim 2, wherein the molecular weight of the low-molecular-weight substance is from 300 to 3000.

* * * * *